(12) United States Patent
Furuyama et al.

(10) Patent No.: US 8,648,375 B2
(45) Date of Patent: Feb. 11, 2014

(54) SEMICONDUCTOR LIGHT EMITTING DEVICE AND LIGHT EMITTING MODULE

(75) Inventors: Hideto Furuyama, Kanagawa-ken (JP);
Akihiro Kojima, Kanagawa-ken (JP);
Miyoko Shimada, Kanagawa-ken (JP);
Yosuke Akimoto, Kanagawa-ken (JP);
Hideyuki Tomizawa, Gunma-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/601,336

(22) Filed: Aug. 31, 2012

(65) Prior Publication Data
US 2013/0313581 A1   Nov. 28, 2013

(30) Foreign Application Priority Data

May 28, 2012   (JP) .................................. 2012-120547

(51) Int. Cl.
*H01L 33/00*   (2010.01)
(52) U.S. Cl.
USPC .................. 257/98; 257/99; 257/100; 257/88; 257/79; 257/E33.061; 257/E33.068; 438/29; 438/27; 438/28; 438/34; 438/22
(58) Field of Classification Search
USPC .................. 257/79, 88, 98, 99, 100, E33.061, 257/E33.068; 438/22, 26, 27, 28, 29, 34, 31
See application file for complete search history.

(56) References Cited

U.S. PATENT DOCUMENTS

| | | | |
|---|---|---|---|
| 7,696,522 B2 * | 4/2010 | Ono et al. .................... | 257/88 |
| 8,110,421 B2 | 2/2012 | Sugizaki et al. | |
| 2010/0081218 A1 * | 4/2010 | Hardin ............................ | 438/7 |
| 2010/0148198 A1 * | 6/2010 | Sugizaki et al. ................ | 257/98 |
| 2011/0012147 A1 * | 1/2011 | Bierhuizen et al. ............. | 257/98 |
| 2011/0114978 A1 | 5/2011 | Kojima et al. | |
| 2011/0133220 A1 * | 6/2011 | Kim et al. ....................... | 257/88 |
| 2011/0284902 A1 * | 11/2011 | Daicho et al. ................... | 257/98 |
| 2012/0056221 A1 * | 3/2012 | Kim ................................ | 257/98 |
| 2012/0063118 A1 * | 3/2012 | Cillessen et al. ............... | 362/84 |
| 2012/0211774 A1 * | 8/2012 | Harada ........................... | 257/88 |

FOREIGN PATENT DOCUMENTS

| | | |
|---|---|---|
| JP | 2010-141176 | 6/2010 |
| JP | 2011-108911 | 6/2011 |

* cited by examiner

*Primary Examiner* — Julio J Maldonado
*Assistant Examiner* — Molly Reida
(74) *Attorney, Agent, or Firm* — Patterson & Sheridan, LLP

(57) ABSTRACT

According to one embodiment, a semiconductor light emitting device includes: a semiconductor layer including a first and second surfaces, and a light emitting layer; a p-side electrode provided on the second surface; an n-side electrode provided on the second surface; a first insulating film covering the p-side and the n-side electrodes; a p-side wiring section electrically connected to the p-side electrode through the first insulating film; an n-side wiring section electrically connected to the n-side electrode through the first insulating film; and a phosphor layer provided on the first surface. The phosphor layer has an upper surface and an oblique surface, the oblique surface forming an obtuse angle with the upper surface and inclined with respect to the first surface. Thickness of the phosphor layer immediately below the oblique surface is smaller than thickness of the phosphor layer immediately below the upper surface.

17 Claims, 25 Drawing Sheets

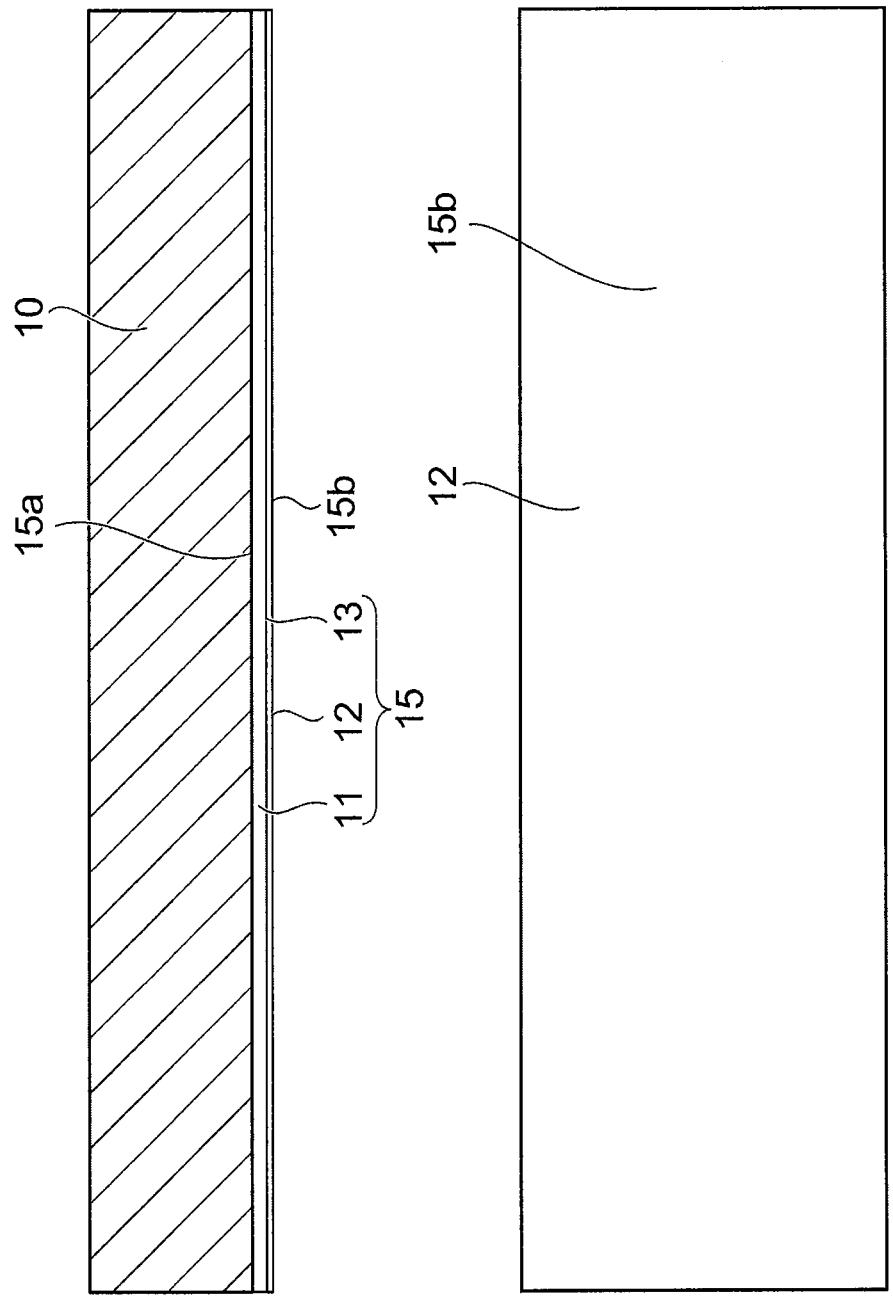

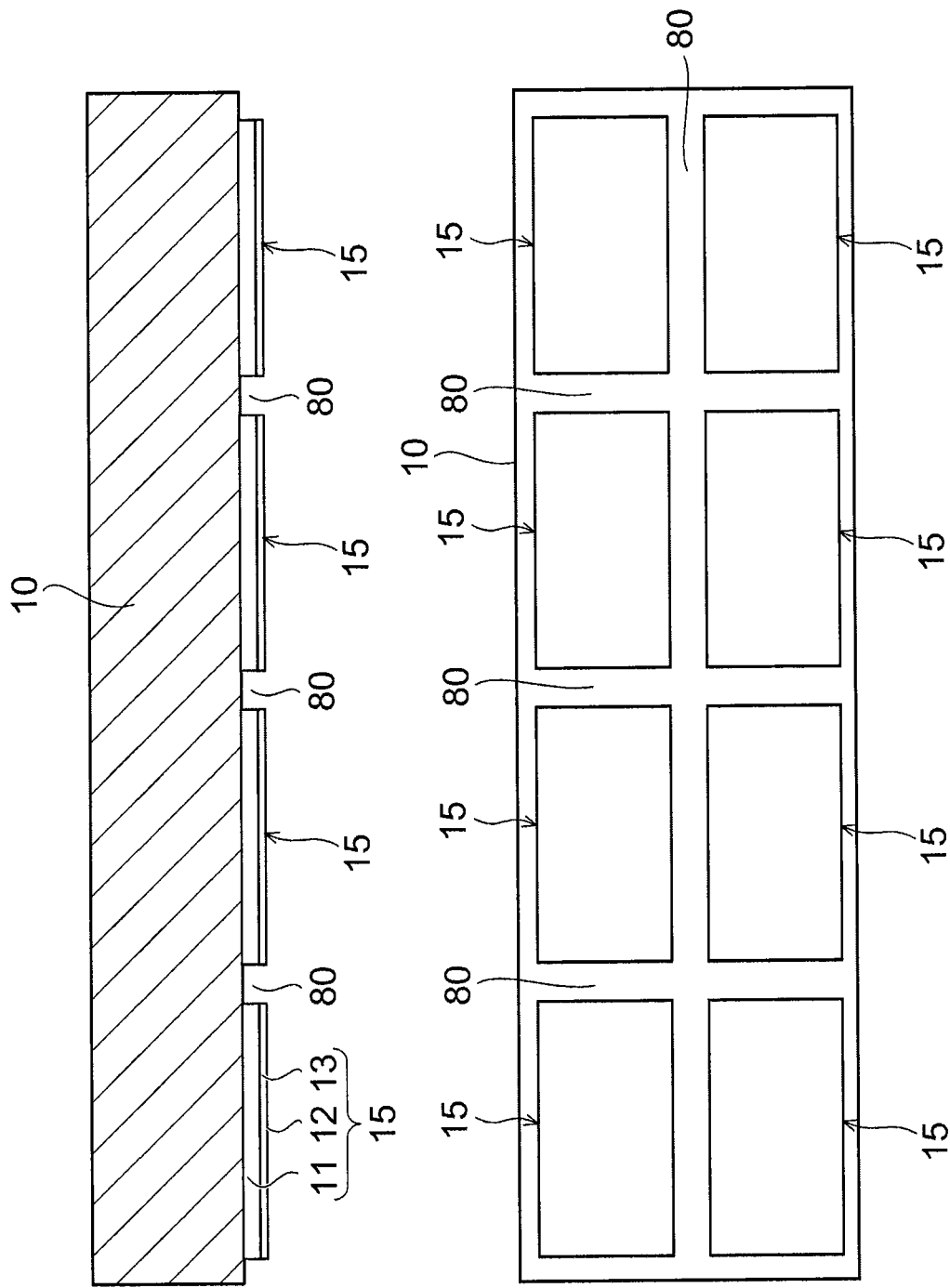

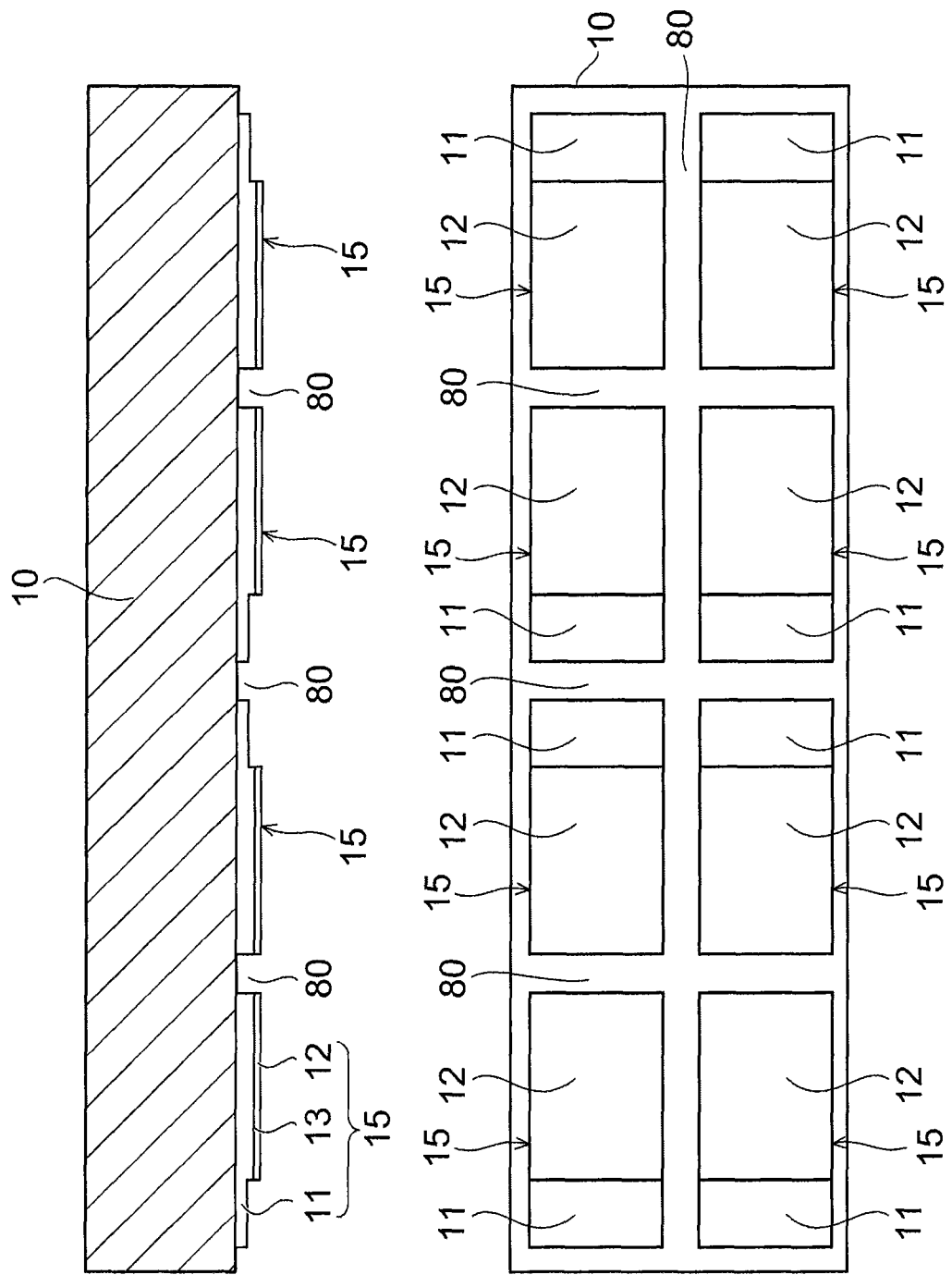

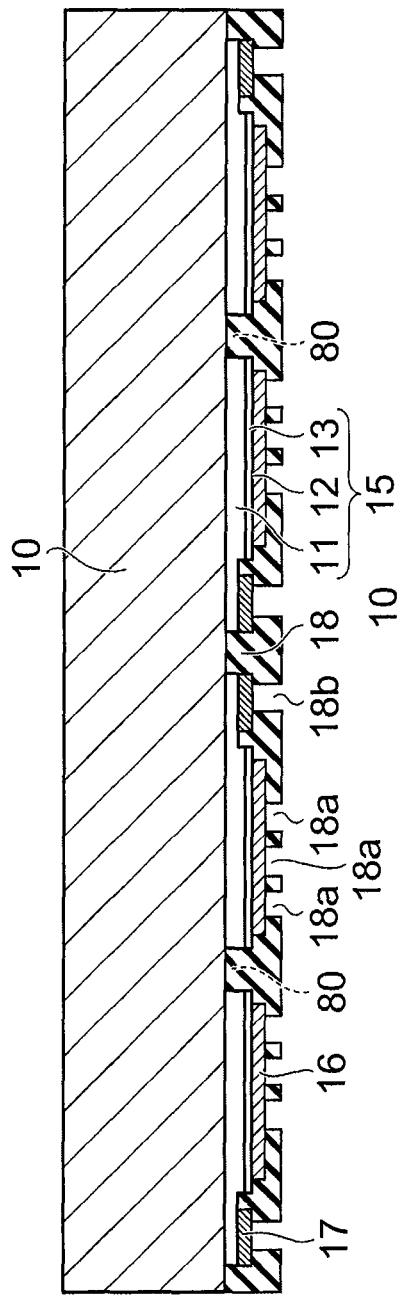
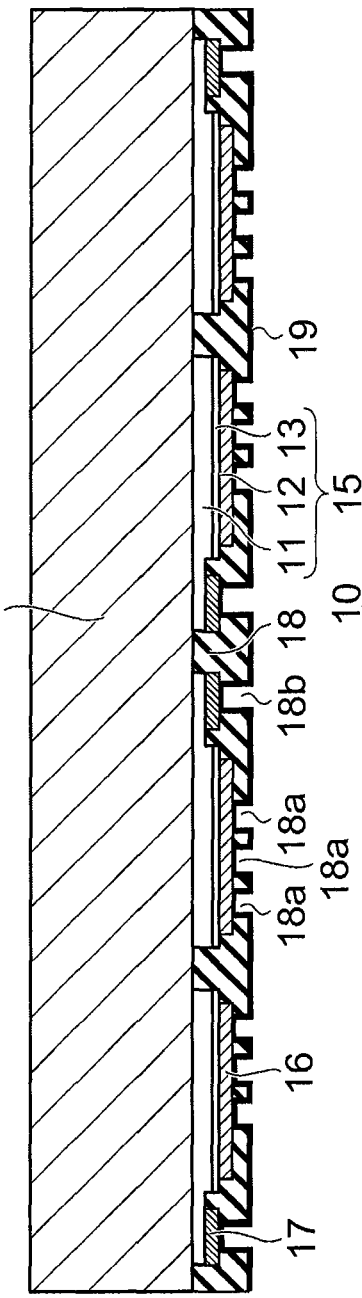
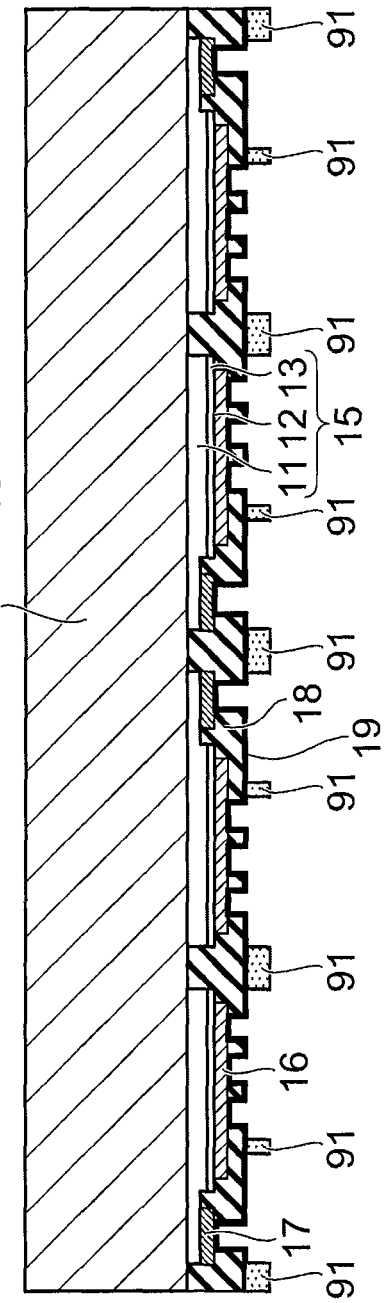
FIG. 19A
FIG. 19B
FIG. 19C

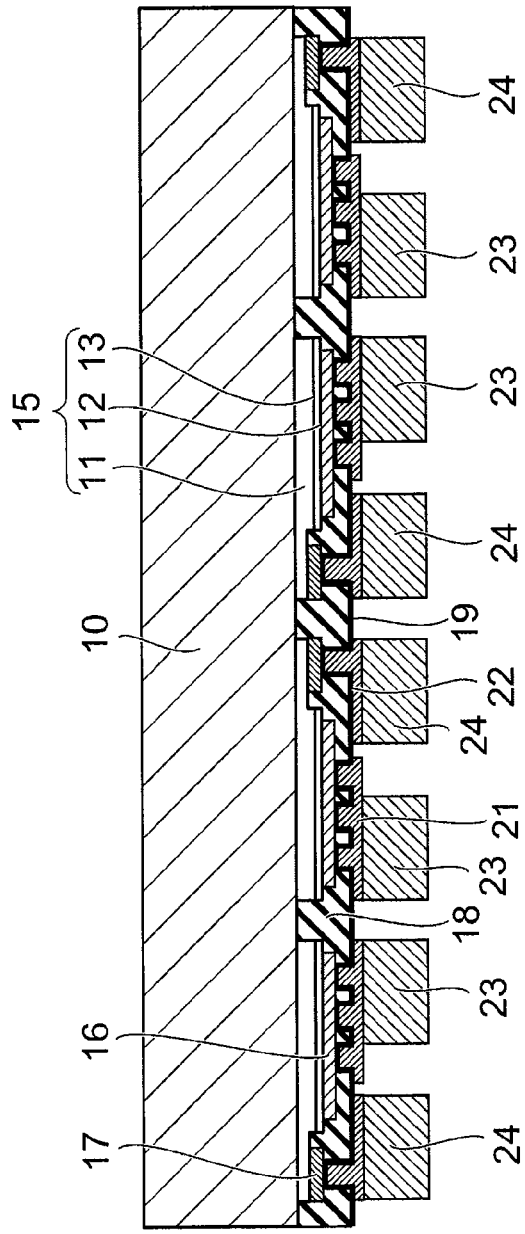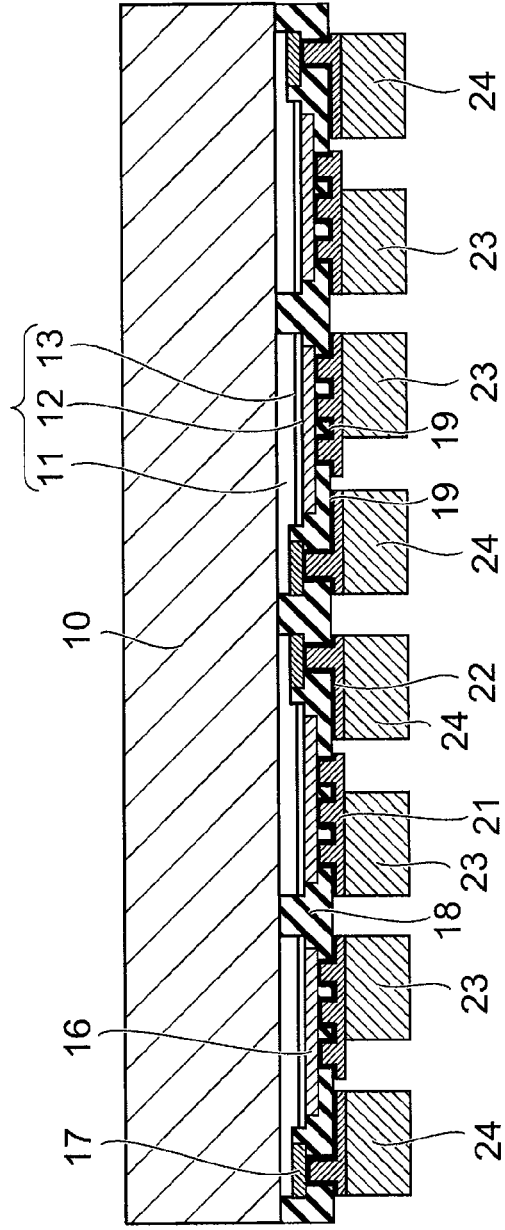
FIG. 23A
FIG. 23B

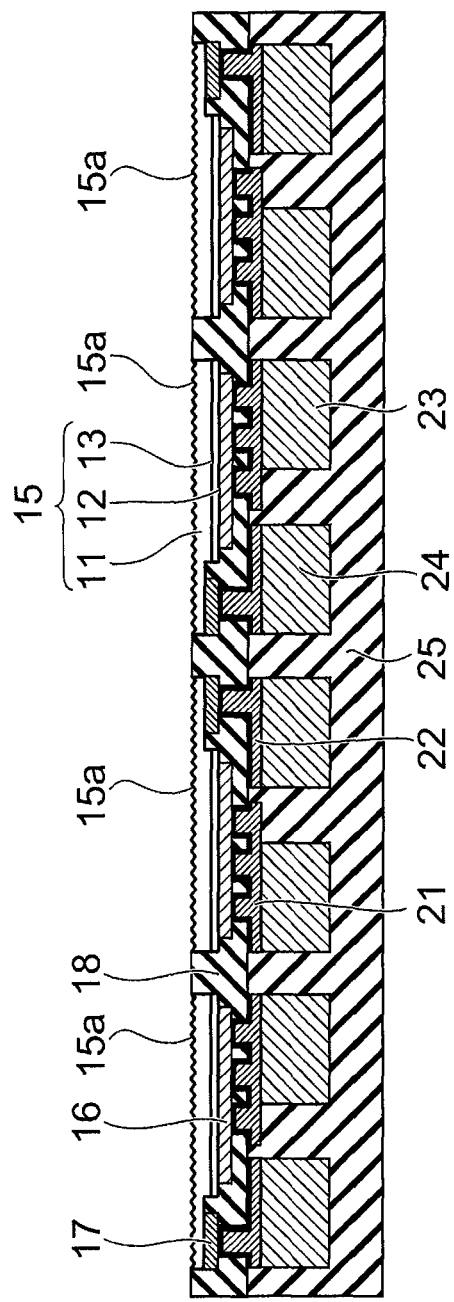
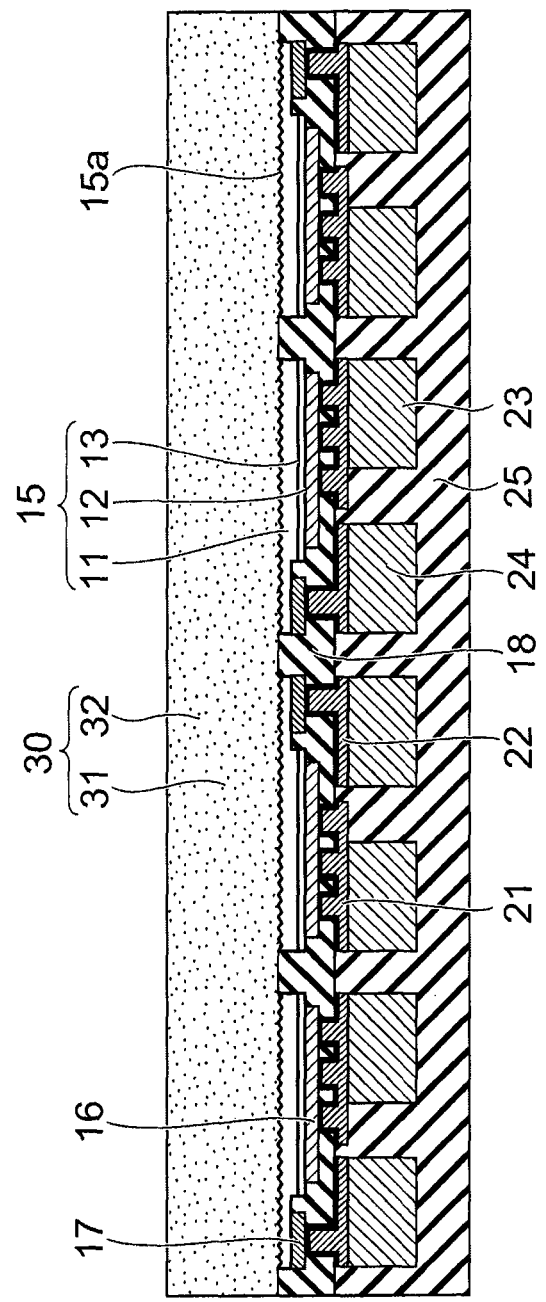
FIG. 25A
FIG. 25B

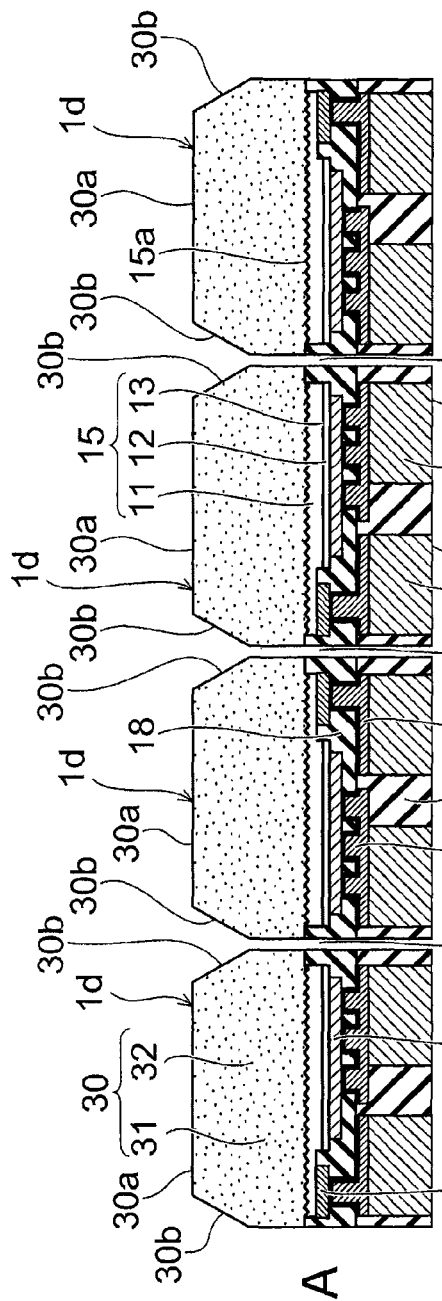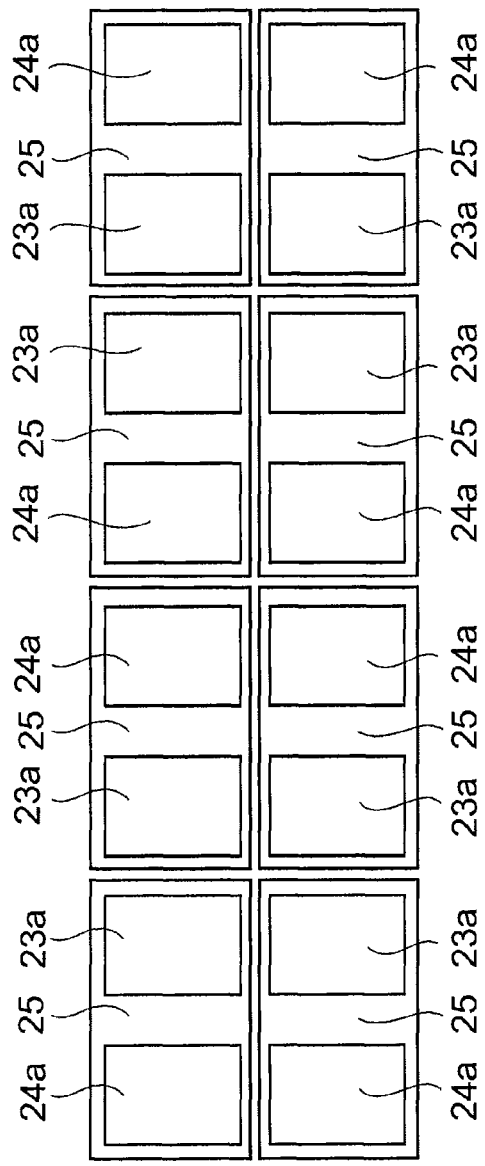
FIG. 26A
FIG. 26B

SEMICONDUCTOR LIGHT EMITTING DEVICE AND LIGHT EMITTING MODULE

CROSS-REFERENCE TO RELATED APPLICATIONS

This application is based upon and claims the benefit of priority from the prior Japanese Patent Application No. 2012-120547, filed on May 28, 2012; the entire contents of which are incorporated herein by reference.

FIELD

Embodiments described herein relate generally to a semiconductor light emitting device and a light emitting module.

BACKGROUND

There is proposed a semiconductor light emitting device in which a phosphor layer of the chip size is provided on the light extraction surface (first surface) of an LED (light emitting diode) chip, and a chip size package including a wiring section is provided on the surface (second surface) opposite from the light extraction surface. Such a semiconductor light emitting device can be obtained by collectively forming a wiring section and a phosphor layer for a plurality of chips in the wafer level, followed by dicing.

BRIEF DESCRIPTION OF THE DRAWINGS

FIGS. 15A to 26B are schematic views showing a method for manufacturing the semiconductor light emitting device of the embodiment.

DETAILED DESCRIPTION

Figure 1A:
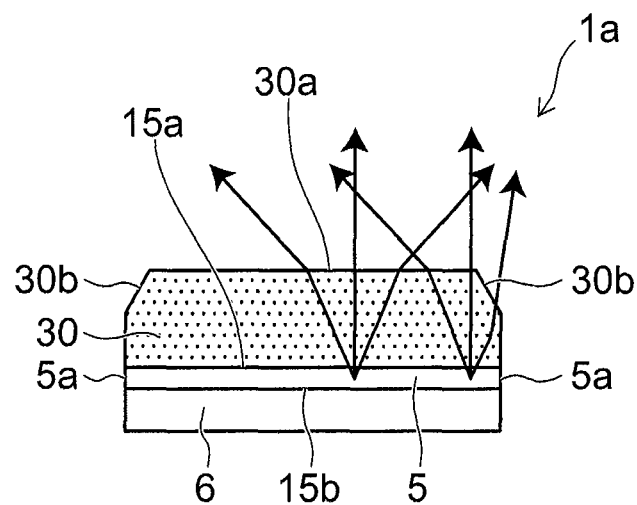
FIG. 1A is a schematic sectional view of a semiconductor light emitting device of a first embodiment.

In general, according to one embodiment, a semiconductor light emitting device includes: a semiconductor layer including a first and second surfaces, and a light emitting layer; a p-side electrode provided on the second surface; an n-side electrode provided on the second surface; a first insulating film covering the p-side and the n-side electrodes; a p-side wiring section electrically connected to the p-side electrode through the first insulating film; an n-side wiring section electrically connected to the n-side electrode through the first insulating film; and a phosphor layer provided on the first surface. The phosphor layer has an upper surface and an oblique surface, the oblique surface forming an obtuse angle with the upper surface and inclined with respect to the first surface. Thickness of the phosphor layer immediately below the oblique surface is smaller than thickness of the phosphor layer immediately below the upper surface.

In general, according to another embodiment, a light emitting module includes: a mounting substrate including a mounting surface and pads provided on the mounting surface; and a plurality of semiconductor light emitting devices mounted on the mounting substrate. The semiconductor light emitting device includes: a semiconductor layer including a first and second surfaces, and a light emitting layer; a p-side electrode provided on the second surface; an n-side electrode provided on the second surface; a first insulating film covering the p-side and the n-side electrodes; a p-side wiring section electrically connected to the p-side electrode through the first insulating film; an n-side wiring section electrically connected to the n-side electrode through the first insulating film; and a phosphor layer provided on the first surface. The phosphor layer has an upper surface and an oblique surface, the oblique surface forming an obtuse angle with the upper surface and inclined with respect to the first surface. Thickness of the phosphor layer immediately below the oblique surface is smaller than thickness of the phosphor layer immediately below the upper surface.

Embodiments will now be described with reference to the drawings. In the drawings, like components are labeled with like reference numerals.

First Embodiment

Figure 1B:
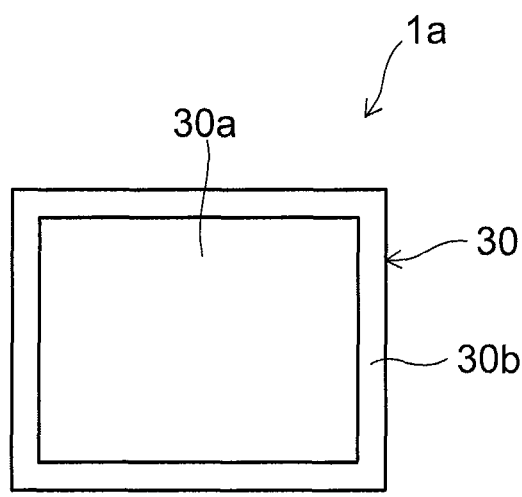
FIG. 1B is a schematic top view of the semiconductor light emitting device.

FIG. 1A is a schematic sectional view of a semiconductor light emitting device 1a of a first embodiment. FIG. 1B is a schematic top view of the semiconductor light emitting device 1a.

The semiconductor light emitting device 1a includes a light emitting element (chip) 5 for emitting excitation light, a phosphor layer 30 provided on the light emitting element 5, and a support body 6 for supporting the light emitting element 5.

The light emitting element 5 is e.g. a light emitting diode (LED). The light emitting element 5 includes a p-type semiconductor layer, an n-type semiconductor layer, and an active layer (light emitting layer) sandwiched between the p-type semiconductor layer and the n-type semiconductor layer, not shown. Furthermore, the light emitting element 5 includes a contact electrode (p-side electrode) to the p-type semiconductor layer and a contact electrode (n-side electrode) to the n-type semiconductor layer.

A semiconductor having a relatively large bandgap (e.g., GaN) is used for the n-type semiconductor layer and the p-type semiconductor layer. A semiconductor having a relatively small bandgap (e.g., InGaN) is inserted as the active layer. This effectively confines injected carriers produced by the pn junction sandwiching the active layer. Thus, light emission by carrier recombination is effectively performed to achieve high light emission efficiency. The active layer may have what is called the MQW (multi-quantum well) structure. The light emitting element chip is not limited to LED, but may be a surface emitting semiconductor laser (surface emitting laser diode, SELD).

The semiconductor layer of the light emitting element 5 has a first surface 15a and a second surface 15b on the opposite side therefrom. The phosphor layer 30 is provided on the first surface 15a.

The p-side electrode and the n-side electrode are provided on the second surface 15b. On the second surface 15b side, the support body 6 is provided. As described later, the support body 6 includes a p-side wiring section and an n-side wiring section connected to the p-side electrode and the n-side electrode, respectively, and serving for connection to an external mounting substrate. Furthermore, the support body 6 includes an insulating film for protecting the light emitting element 5, the electrodes, and the wiring sections.

The phosphor layer 30 is not provided below the second surface 15b of the light emitting element 5. The planar size of the phosphor layer 30 is nearly equal to the planar size of the light emitting element 5. The planar size of the support body 6 is also nearly equal to the planar size of the light emitting element 5. Thus, the semiconductor light emitting device 1a has a chip size package structure.

The phosphor layer 30 includes a resin layer as a transparent medium, and a plurality of phosphor particles excited by excitation light of the light emitting element 5 to emit fluorescence. The resin layer is made of e.g. silicone resin or epoxy resin transparent to the excitation light of the light emitting element 5 and the fluorescence of the phosphor. The phosphor is dispersed in the resin layer.

For the phosphor, various phosphor materials can be used singly or in combination. For instance, the excitation light wavelength (emission wavelength) of the light emitting element 5 is set to 450 nm. Then, using yellow phosphors such as $Y_3Al_5O_{12}$ (YAG):Ce, $Tb_{3-x}RE_xO_{12}$:Ce (TAG) (RE=Y, Gd, La, Lu), and $Sr_{2-x-y}Ba_xCa_ySiO_4$:Eu, a white output light source is obtained.

Furthermore, by setting the excitation light wavelength of the light emitting element 5 to 450 nm and using a red phosphor such as YAG:Nb, $Sr_xCa_{1-x}S$:Eu, $CaSiAlN_3$:Eu, and $Sr_{2-y}Ca_ySiO_4$:Eu and a green phosphor such as $SrGa_2S_4$:Eu, $Sr_{2-y}Ba_ySiO_4$:Eu, and $SrSi_2O_2N_2$:Eu in combination, a white light source with high color rendition can be realized.

The phosphor layer 30 has an upper surface 30a parallel to the first surface 15a of the light emitting element 5. The angle between the upper surface 30a and the side surface of the phosphor layer 30 is formed in an obliquely cut (chamfered) shape. Thus, an oblique surface 30b is formed between the upper surface 30a and the side surface.

The oblique surface 30b forms an obtuse angle with the upper surface 30a, and is inclined with respect to the first surface 15a of the light emitting element 5. As shown in the top view of FIG. 1B showing the upper surface 30a of the phosphor layer 30, the oblique surface 30b is provided continuously throughout the periphery of the upper surface 30a.

The angle between the upper surface 30a and the oblique surface 30b is located inside the edge 5a of the light emitting element 5 in the planar direction of the first surface 15a. The oblique surface 30b is inclined downward from the angle toward the edge 5a of the light emitting element 5.

The thickness (in the direction perpendicular to the first surface 15a) of the phosphor layer 30 immediately below the oblique surface 30b is smaller than the thickness (in the direction perpendicular to the first surface 15a) of the phosphor layer 30 immediately below the upper surface 30a. Thus, the phosphor layer 30 near the edge 5a of the light emitting element 5 is thinner than the phosphor layer 30 above the center of the first surface 15a of the light emitting element 5.

Second Embodiment

Figure 2A:
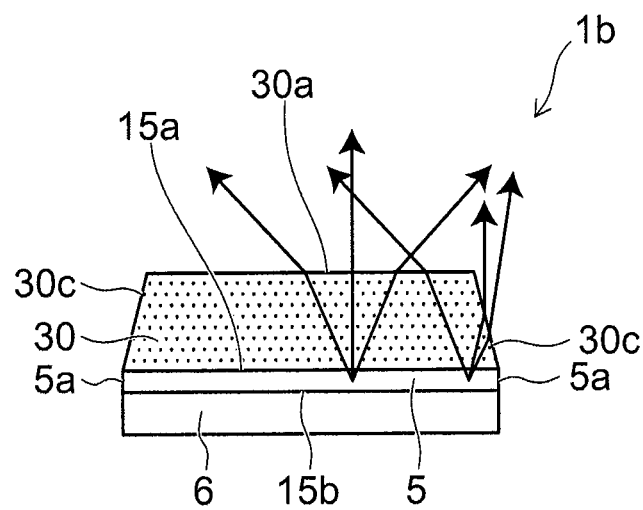
FIG. 2A is a schematic sectional view of a semiconductor light emitting device of a second embodiment.
Figure 2B:
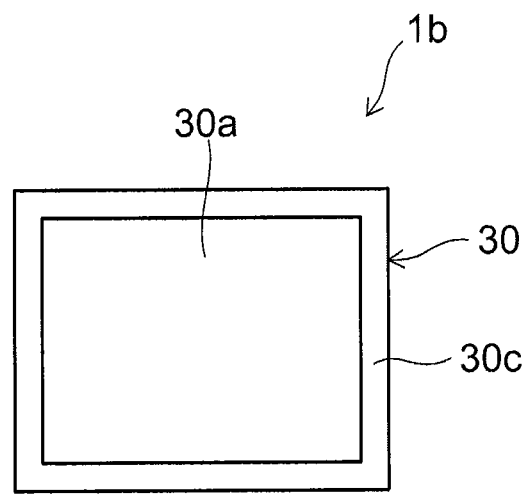
FIG. 2B is a schematic top view of the semiconductor light emitting device.

FIG. 2A is a schematic sectional view of a semiconductor light emitting device 1b of a second embodiment. FIG. 2B is a schematic top view of the semiconductor light emitting device 1b.

This semiconductor light emitting device 1b also includes a light emitting element (chip) 5 for emitting excitation light, a phosphor layer 30 provided on the light emitting element 5, and a support body 6 for supporting the light emitting element 5.

The phosphor layer 30 is not provided below the second surface 15b of the light emitting element 5. The planar size of the phosphor layer 30 is nearly equal to the planar size of the light emitting element 5. The planar size of the support body 6 is also nearly equal to the planar size of the light emitting element 5. Thus, the semiconductor light emitting device 1b has a chip size package structure.

The phosphor layer 30 has an upper surface 30a parallel to the first surface 15a of the light emitting element 5. The side surface of the phosphor layer 30 forms an obtuse angle with the upper surface 30a, and constitutes an oblique surface 30c inclined with respect to the first surface 15a of the light emitting element 5. The side surface of the phosphor layer 30 entirely constitutes the oblique surface 30c.

As shown in the top view of FIG. 2B showing the upper surface 30a of the phosphor layer 30, the oblique surface 30c is provided continuously throughout the periphery of the upper surface 30a.

The angle between the upper surface 30a and the oblique surface 30c is located inside the edge 5a of the light emitting element 5 in the planar direction of the first surface 15a. The oblique surface 30c is inclined downward from the angle toward the edge 5a of the light emitting element 5.

The thickness (in the direction perpendicular to the first surface 15a) of the phosphor layer 30 immediately below the oblique surface 30c is smaller than the thickness (in the direction perpendicular to the first surface 15a) of the phosphor layer 30 immediately below the upper surface 30a. Thus, the phosphor layer 30 near the edge 5a of the light emitting element 5 is thinner than the phosphor layer 30 above the center of the first surface 15a of the light emitting element 5.

Third Embodiment

Figure 3A:
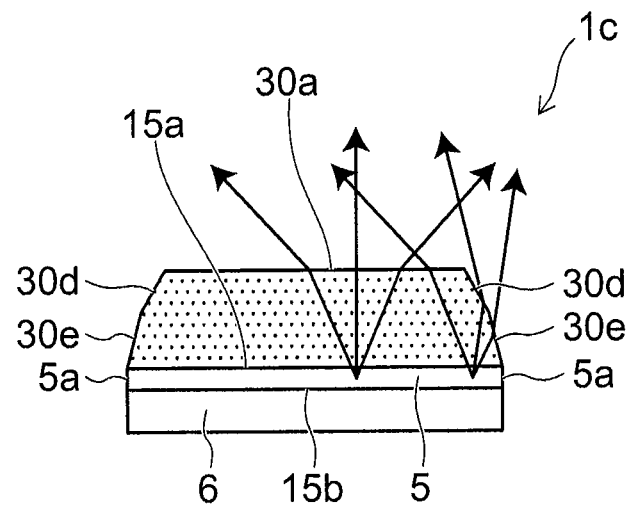
FIG. 3A is a schematic sectional view of a semiconductor light emitting device of a third embodiment.
Figure 3B:
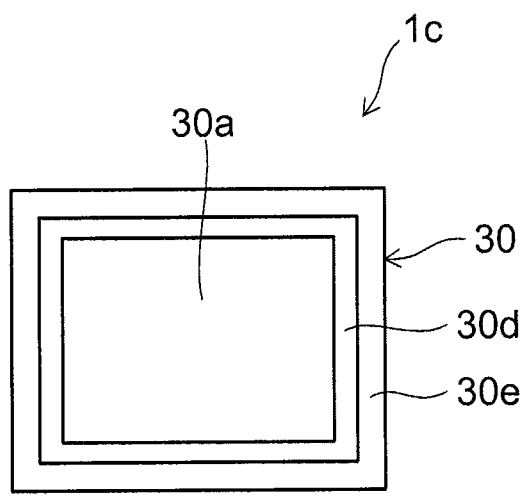
FIG. 3B is a schematic top view of the semiconductor light emitting device.

FIG. 3A is a schematic sectional view of a semiconductor light emitting device is of a third embodiment. FIG. 3B is a schematic top view of the semiconductor light emitting device 1c.

This semiconductor light emitting device is also includes a light emitting element (chip) 5 for emitting excitation light, a phosphor layer 30 provided on the light emitting element 5, and a support body 6 for supporting the light emitting element 5.

The phosphor layer 30 is not provided below the second surface 15b of the light emitting element 5. The planar size of the phosphor layer 30 is nearly equal to the planar size of the light emitting element 5. The planar size of the support body 6 is also nearly equal to the planar size of the light emitting element 5. Thus, the semiconductor light emitting device 1c has a chip size package structure.

The phosphor layer 30 has an upper surface 30a parallel to the first surface 15a of the light emitting element 5. The side surface of the phosphor layer 30 is composed of two oblique surfaces 30d and 30e. The two oblique surfaces 30d and 30e are inclined with respect to the first surface 15a of the light emitting element 5. Furthermore, the two oblique surfaces 30d and 30e have different inclination angles with respect to the first surface 15a.

The oblique surface 30d forms an obtuse angle with the upper surface 30a, and is provided between the upper surface 30a and the oblique surface 30e. The oblique surface 30e forms an obtuse angle with the oblique surface 30d and continues to the oblique surface 30d.

As shown in the top view of FIG. 3B showing the upper surface 30a of the phosphor layer 30, the oblique surfaces 30d and 30e are each provided continuously throughout the periphery of the upper surface 30a.

The angle between the upper surface 30a and the oblique surface 30d is located inside the edge 5a of the light emitting element 5 in the planar direction of the first surface 15a. The oblique surface 30d is inclined downward from the angle with respect to the upper surface 30a toward the oblique surface 30e. The angle between the oblique surface 30d and the oblique surface 30e is also located inside the edge 5a of the light emitting element 5 in the planar direction of the first surface 15a. The oblique surface 30e is inclined downward from the angle with respect to the oblique surface 30d toward the edge 5a of the light emitting element 5.

The thickness (in the direction perpendicular to the first surface 15a) of the phosphor layer 30 immediately below the oblique surface 30d and the thickness (in the direction perpendicular to the first surface 15a) of the phosphor layer 30 immediately below the oblique surface 30e are smaller than the thickness (in the direction perpendicular to the first surface 15a) of the phosphor layer 30 immediately below the upper surface 30a. Thus, the phosphor layer 30 near the edge 5a of the light emitting element 5 is thinner than the phosphor layer 30 above the center of the first surface 15a of the light emitting element 5.

In all the semiconductor light emitting devices 1a-1c of the embodiment described above, the angle between the upper surface 30a and the side surface of the phosphor layer 30 is formed not at a right angle but at an obtuse angle. Thus, the oblique surfaces 30b-30e are formed in the end portion of the phosphor layer 30.

The angle of the phosphor layer 30 formed not at a right angle but at an obtuse angle can suppress light distribution disturbance due to optical vignetting at the angle of the phosphor layer 30. Furthermore, the optical component emitted upward in the end portion of the light emitting element 5 increases. This can increase the efficacy of a lighting fixture using the semiconductor light emitting device of the embodiment as a light source.

Furthermore, in the semiconductor light emitting device 1c shown in FIGS. 3A and 3B, the side surface of the phosphor layer 30 is formed from a plurality of (e.g., in the figures, two) oblique surfaces 30d and 30e having different inclination angles with respect to the first surface 15a. Thus, the phosphor layer 30 can function as a convex lens.

The number of the plurality of oblique surfaces and the inclination angles thereof can be arbitrarily adjusted to design lens characteristics as desired. The phosphor layer 30 can be caused to function also as a lens. This eliminates the need to separately provide a lens on the first surface 15a. Thus, the structure is simplified, and the cost can be reduced.

The light to the lateral direction at a large angle with respect to the direction perpendicular to the light extraction surface (first surface 15a) of the light emitting element 5 travels a longer distance in the phosphor layer 30 than the light emitted directly upward. This is likely to cause color breakup in which the laterally emitted light is made close to the fluorescent color.

However, in the semiconductor light emitting devices 1a-1c of the embodiment, the oblique surfaces 30b-30e are formed in the end portion of the phosphor layer 30. Thus, the thickness of the phosphor layer 30 on the side of the end portion of the light emitting element 5 is made smaller than the thickness of the phosphor layer 30 on the side of the center of the first surface 15a. This increases the excitation light emission component to the lateral direction, and can alleviate color breakup.

Figure 4A:
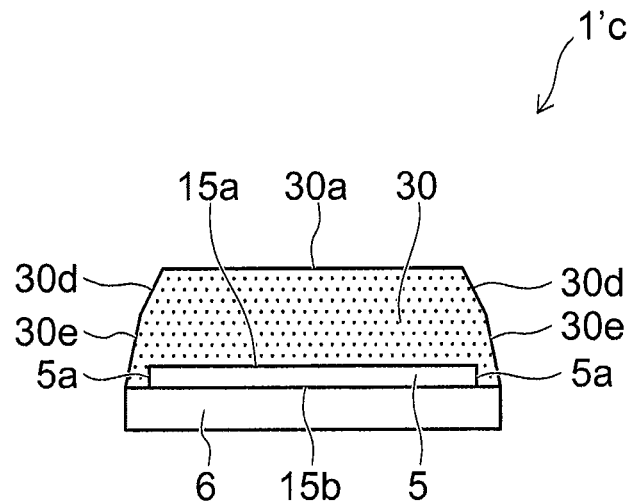
FIG. 4A is a schematic sectional view of a semiconductor light emitting device of a variation of the semiconductor light emitting device of the third embodiment.
Figure 4B:
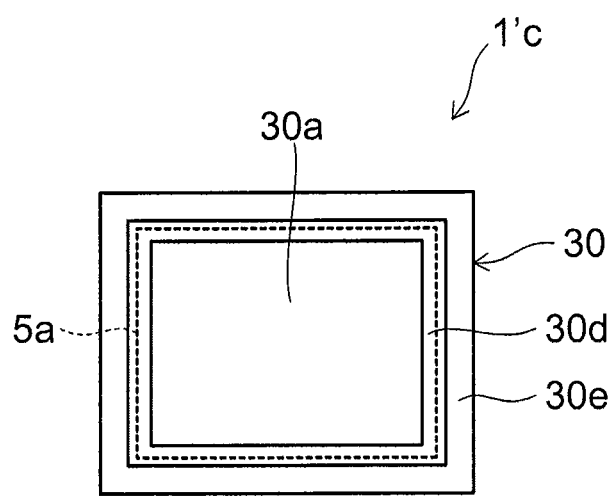
FIG. 4B is a schematic top view thereof.

FIGS. 4A and 4B show a semiconductor light emitting device 1'c of a variation of the semiconductor light emitting device 1c of the third embodiment. FIG. 4A is a schematic sectional view of the semiconductor light emitting device 1'c. FIG. 4B is a schematic top view thereof.

In this semiconductor light emitting device 1'c, the edge (of the semiconductor layer) 5a of the light emitting element 5 is located inside the edge of the phosphor layer 30 in the planar direction of the first surface 15a. That is, the phosphor layer 30 covers and protects the edge 5a of the light emitting element 5.

Figure 5A:
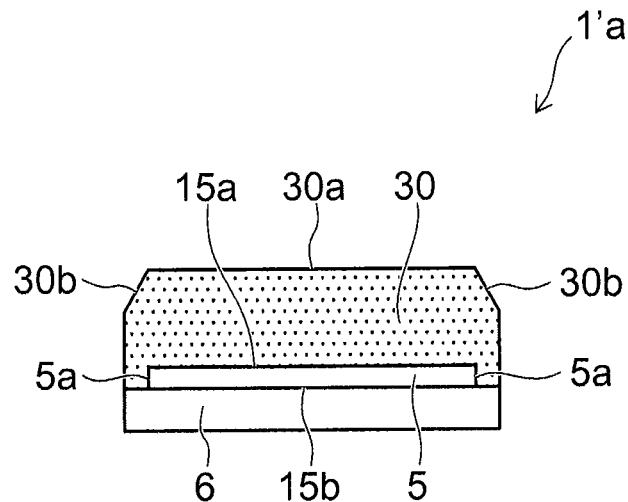
FIG. 5A is a schematic sectional view showing a semiconductor light emitting device of a variation of the semiconductor light emitting device of the first embodiment.
Figure 5B:
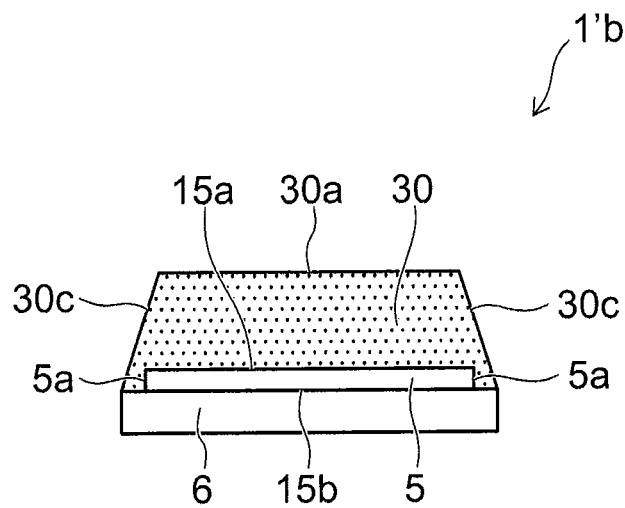
FIG. 5B is a schematic sectional view showing a semiconductor light emitting device of a variation of the semiconductor light emitting device of the second embodiment.

FIG. 5A is a schematic sectional view showing a semiconductor light emitting device 1'a of a variation of the semiconductor light emitting device is of the first embodiment. FIG. 5B is a schematic sectional view showing a semiconductor light emitting device 1'b of a variation of the semiconductor light emitting device 1b of the second embodiment.

Also in these semiconductor light emitting devices 1'a and 1'b, the edge (of the semiconductor layer) 5a of the light emitting element 5 is located inside the edge of the phosphor layer 30. Thus, the phosphor layer 30 covers and protects the edge 5a of the light emitting element 5.

Next, a light emitting module of the embodiment is described.

Figure 6A:
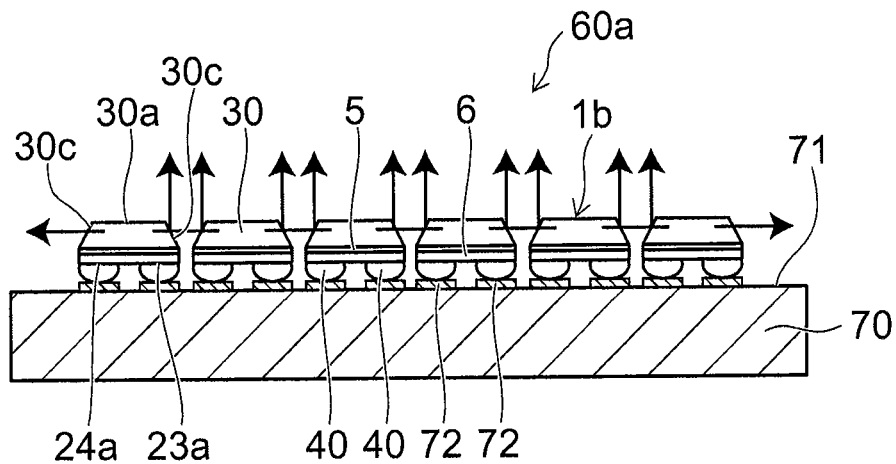
FIGS. 6A to 6C are schematic sectional views of a light emitting module of the embodiment.

FIG. 6A is a schematic sectional view of a light emitting module 60a using the semiconductor light emitting device 1b shown in FIGS. 2A and 2B.

The light emitting module 60a includes a mounting substrate 70 and a plurality of semiconductor light emitting devices 1b mounted on the mounting substrate 70 and spaced from each other.

The mounting substrate 70 includes a substrate based on e.g. a resin substrate or ceramic substrate, pads 72 provided on a mounting surface 71 being one surface of the substrate, and a wiring pattern (not shown) provided on the mounting surface 71 and connected to the pads 72.

Alternatively, as a base substrate of the mounting substrate 70, a metal plate superior in heat dissipation may be used. In this case, an insulating film is provided on the metal plate, and pads 72 and a wiring pattern are formed on the insulating film.

As described later with reference to e.g. FIG. 10, the semiconductor light emitting device 1b includes a p-side external terminal 23a and an n-side external terminal 24a exposed at the same surface. The semiconductor light emitting device 1b is mounted on the mounting substrate 70 in the posture in which the surface exposing the p-side external terminal 23a and the n-side external terminal 24a is directed to the mounting surface 71 and the first surface (light extraction surface) 15a is directed upward from the mounting surface 71. The upper surface 30a of the phosphor layer 30 is parallel to the mounting surface 71 of the mounting substrate 70. The oblique surface 30c of the phosphor layer 30 is inclined with respect to the mounting surface 71 of the mounting substrate 70.

The p-side external terminal 23a and the n-side external terminal 24a are bonded to the pads 72 via a bonding material such as solder 40. The light emitting layer of the light emitting element 5 is electrically connected to the wiring pattern of the mounting substrate 70 via the p-side electrode, n-side electrode, p-side wiring section, n-side wiring section, p-side external terminal 23a, n-side external terminal 24a, solder 40, and pads 72.

Figure 9:
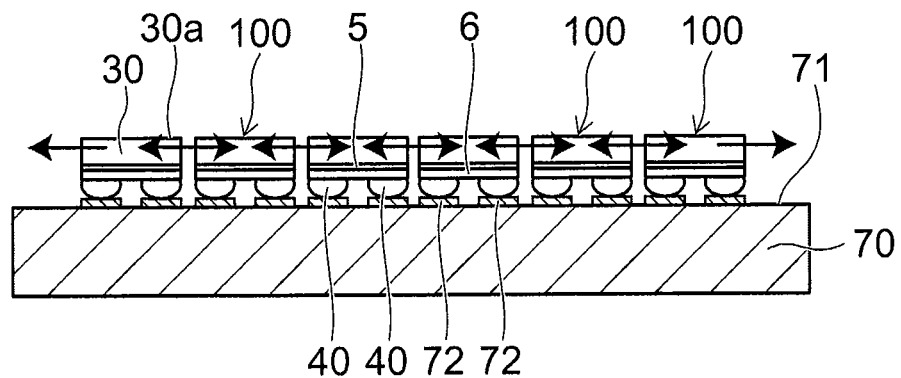
FIG. 9 shows a schematic sectional view of a light emitting module of a comparative example.

Here, FIG. 9 shows a schematic sectional view of a light emitting module of a comparative example. The phosphor layer 30 of a semiconductor light emitting device 100 in the light emitting module of this comparative example is formed in a rectangular solid shape. The angle between the upper surface 30a and the side surface of the phosphor layer 30 is a right angle.

In this comparative example, if the distance between the adjacent semiconductor light emitting devices 100 is too short, the laterally emitted light is interrupted by the adjacent semiconductor light emitting device 100 and is not likely to be emitted upward. This hampers high density mounting.

In contrast, according to the embodiment, the laterally emitted light is reflected upward by the oblique surface 30c of the phosphor layer 30 of the adjacent semiconductor light emitting device 1b to increase upward light emission efficiency. As a result, a plurality of semiconductor light emitting devices 1b can be densely mounted with a reduced distance to each other. Thus, the power density can be increased.

Figure 6B:
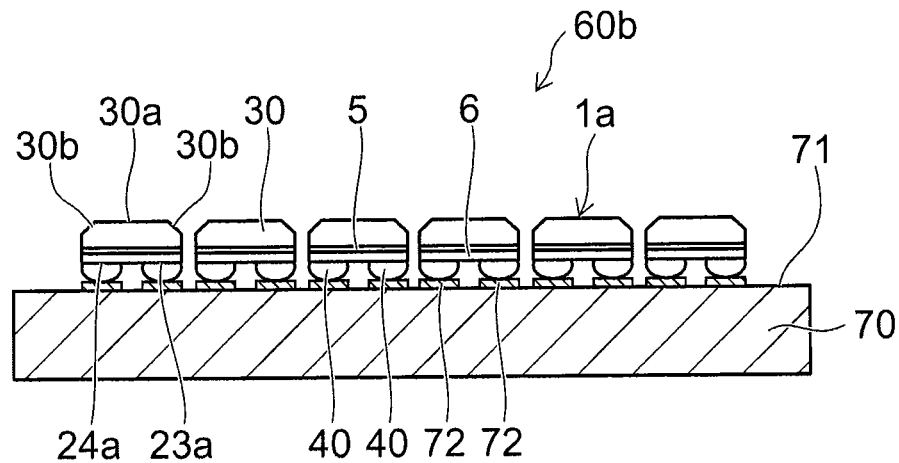
Figure 6C:
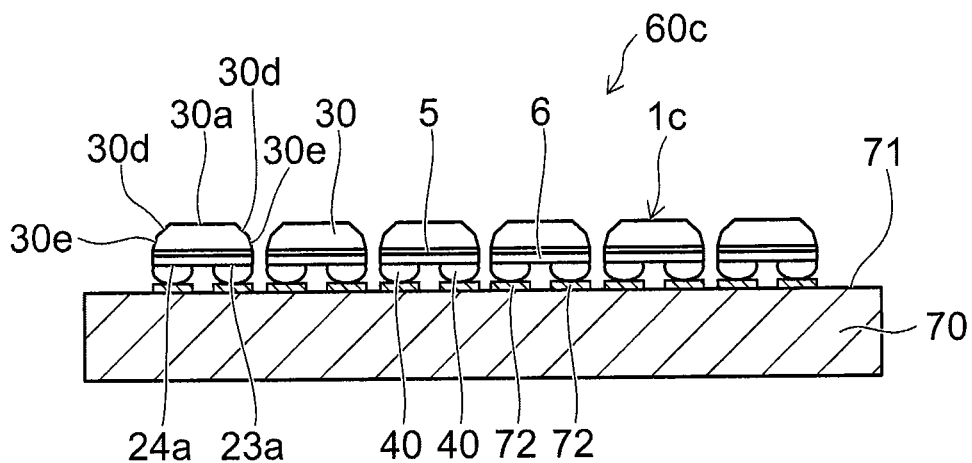

The semiconductor light emitting device mounted on the mounting substrate 70 may be, as shown in FIG. 6B, the aforementioned semiconductor light emitting device 1a of FIGS. 1A and 1B, or as shown in FIG. 6C, the semiconductor light emitting device 1c of FIGS. 3A and 3B.

Also in the light emitting module 60b shown in FIG. 6B and the light emitting module 60c shown in FIG. 6C, the laterally emitted light is reflected upward by the oblique surface of the phosphor layer 30 of the adjacent semiconductor light emitting device to increase upward light emission efficiency. As a result, a plurality of semiconductor light emitting devices can be densely mounted with a reduced distance to each other. Thus, the power density can be increased.

Furthermore, a similar effect is achieved in a light emitting module in which the semiconductor light emitting device 1'c shown in FIGS. 4A and 4B, the semiconductor light emitting device 1'a shown in FIG. 5A, and the semiconductor light emitting device 1'b shown in FIG. 5B are mounted on the mounting substrate 70.

Next, a method for manufacturing the semiconductor light emitting device of the embodiment is described. FIGS. 7A to 7E show the method for manufacturing the semiconductor light emitting device 1b shown in FIGS. 2A and 2B.

Figure 7A:
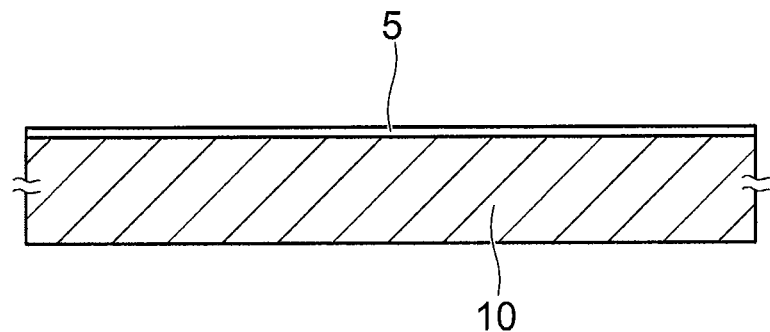
FIGS. 7A to 8C are schematic sectional views showing a method for manufacturing the semiconductor light emitting device of the embodiment.

The light emitting element 5 includes e.g. a gallium nitride-based semiconductor layer. The semiconductor layer is formed on a substrate 10 as shown in FIG. 7A. The substrate 10 can be e.g. a sapphire substrate or silicon substrate.

Figure 7B:
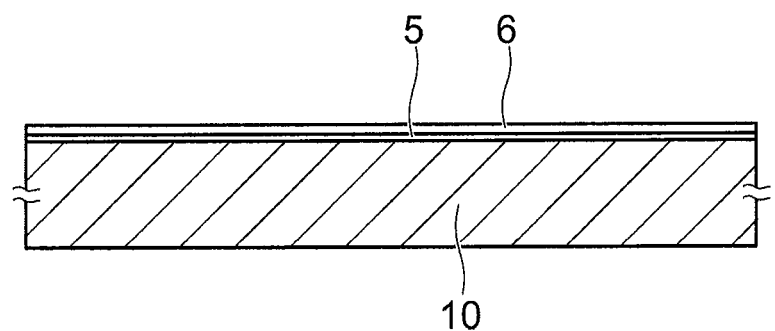

After forming electrodes on the light emitting element 5, a support body 6 including a wiring section connected to the electrodes and an insulating film is formed on the light emitting element 5 as shown in FIG. 7B.

Figure 7C:
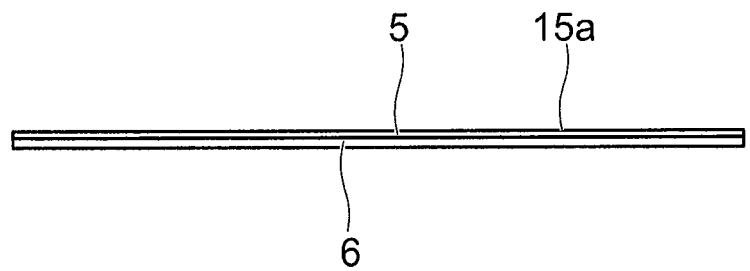

Then, the substrate 10 is removed. FIG. 7C shows a stacked body of the light emitting element 5 and the support body 6 after the removal of the substrate 10. The stacked body is shown upside down from FIG. 7B, with the support body 6 located below and the light emitting element 5 located above.

By the removal of the substrate 10, the first surface 15a of the light emitting element 5 is exposed. On the first surface 15a, a phosphor layer 30 is formed as shown in FIG. 7D.

Figure 7D:
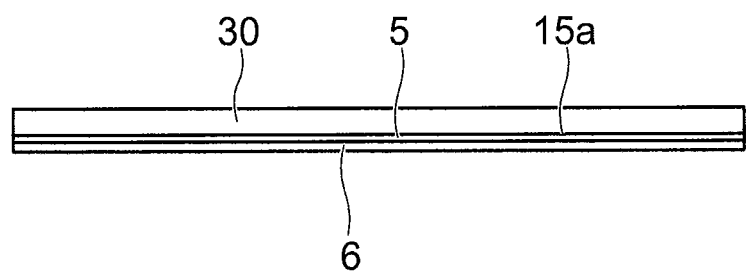
Figure 7E:
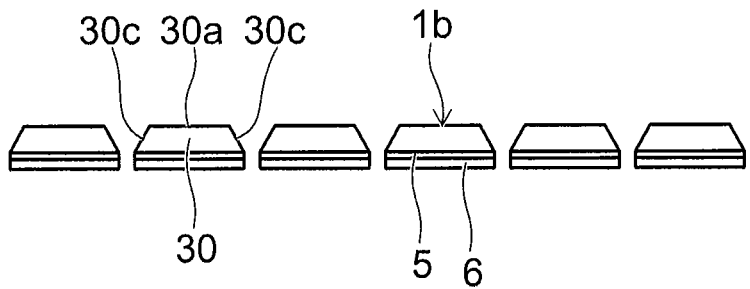

Then, the stacked body shown in FIG. 7D is diced and singulated into a plurality, of semiconductor light emitting devices 1b as shown in FIG. 7E.

Here, a blade having a V-shaped cross section is used to cut the phosphor layer 30 from its upper surface 30a side. Thus, an oblique surface 30c can be formed on the phosphor layer 30.

Likewise, also in the semiconductor light emitting device 1a shown in FIGS. 1A and 1B and the semiconductor light emitting device 1c shown in FIGS. 3A and 3B, a blade having a V-shaped cross section is used to cut the phosphor layer 30 from its upper surface 30a side. Thus, an oblique surface can be formed on the phosphor layer 30.

Figure 8A:
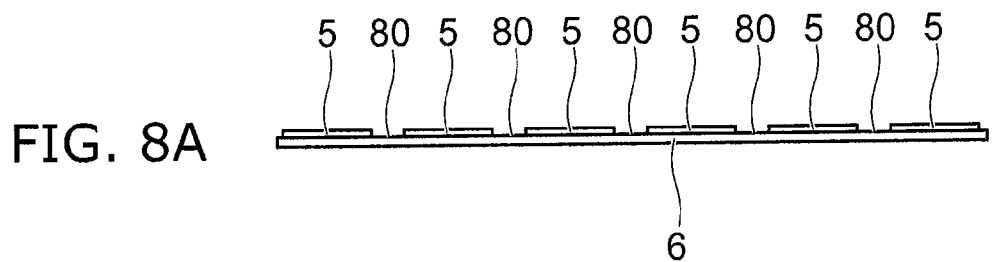
Figure 8B:
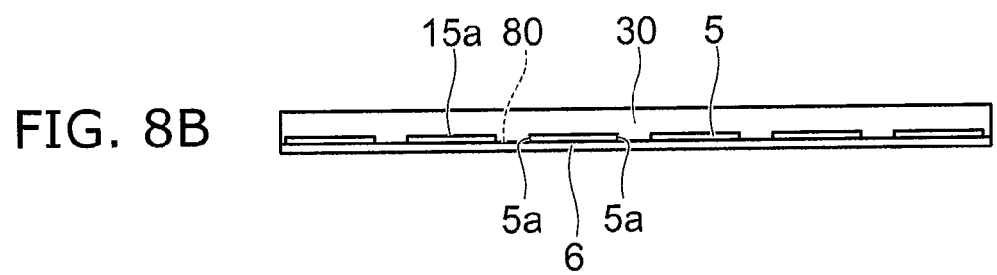
Figure 8C:
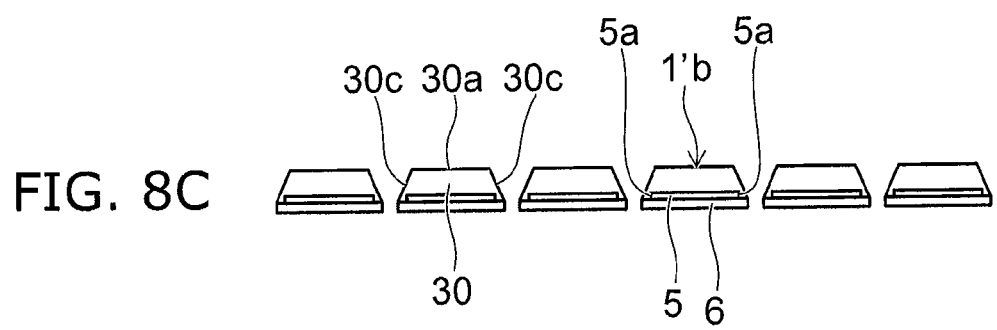

FIGS. 8A to 8C are schematic sectional views showing a method for manufacturing the semiconductor light emitting device 1'b shown in FIG. 5B.

The steps shown in FIGS. 7A to 7C up to the removal of the substrate 10 are performed similarly to the foregoing. Then, after the substrate 10 is removed, as shown in FIG. 8A, the light emitting element 5 is separated into a plurality on the support body 6. For instance, by etching, part of the light emitting element (semiconductor layer) 5 is removed to form a trench 80 separating the light emitting element 5 into a plurality. The trench 80 is formed like a lattice in the light emitting element 5 spread like a wafer.

Then, as shown in FIG. 8B, on the first surface 15a of the light emitting element 5, a phosphor layer 30 is formed. The phosphor layer 30 is embedded also in the trench 80. Thus, the edge 5a of each of a plurality of separated light emitting elements 5 is covered with the phosphor layer 30.

Then, at the position of the trench 80, the phosphor layer 30 and the support body 6 are diced. Thus, as shown in FIG. 8C, a semiconductor light emitting device 1'b with the edge 5a of the light emitting element 5 covered and protected with the phosphor layer 30 is obtained. Also in this dicing, a blade having a V-shaped cross section is used to cut the phosphor layer 30 from the upper surface 30a side. Thus, an oblique surface 30c can be formed on the phosphor layer 30.

The semiconductor light emitting device 1'c shown in FIGS. 4A and 4B and the semiconductor light emitting device 1'a shown in FIG. 5A can also be similarly manufactured by embedding the phosphor layer 30 between a plurality of separated light emitting elements 5.

Next, an example of the light emitting element (chip) and the support body is described below.

Fourth Embodiment

Figure 10:
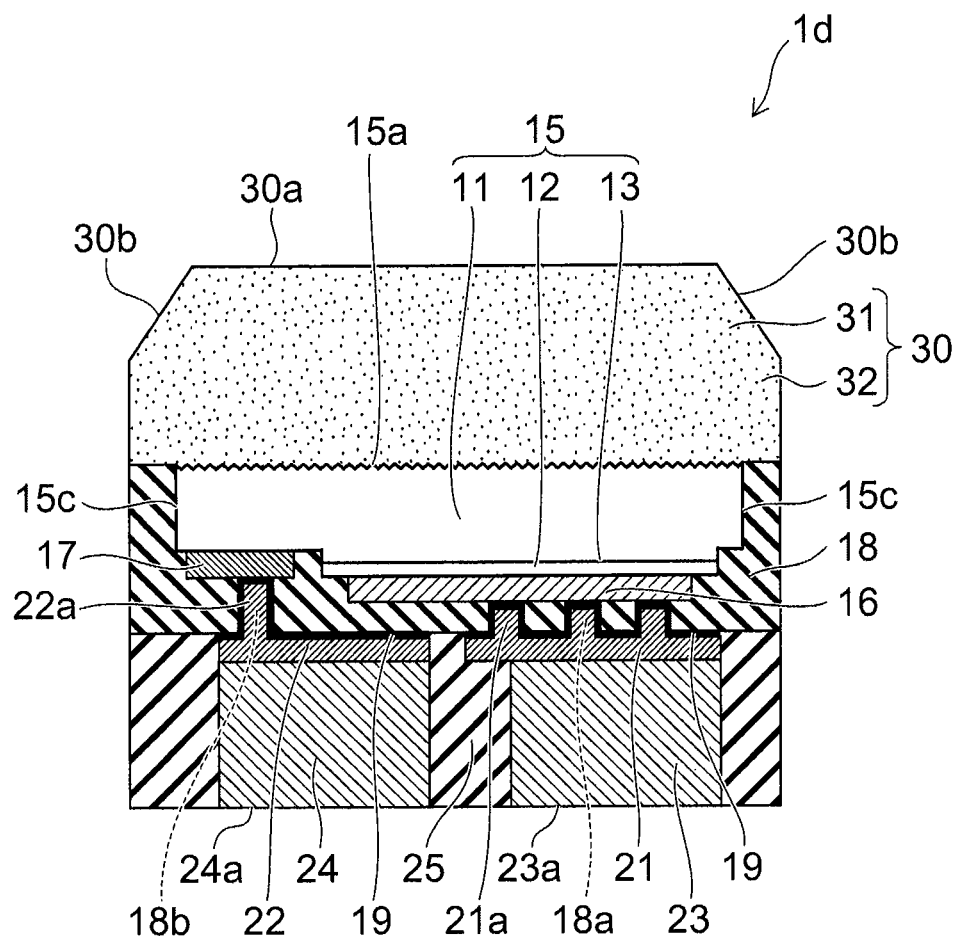
FIG. 10 is a schematic sectional view of a semiconductor light emitting device of a fourth embodiment.

FIG. 10 is a schematic sectional view of a semiconductor light emitting device 1*d* of a fourth embodiment.

The semiconductor light emitting device 1*d* includes a semiconductor layer 15 including a light emitting layer 13. The semiconductor layer 15 has a first surface 15*a* and a second surface 15*b* on the opposite side therefrom. On the second surface side, electrodes and a wiring section are provided. Light is emitted primarily from the first surface 15*a* where the electrodes and the wiring section are not provided.

The semiconductor layer 15 includes a first semiconductor layer 11 and a second semiconductor layer 12. The first semiconductor layer 11 and the second semiconductor layer 12 contain e.g. gallium nitride. The first semiconductor layer 11 includes e.g. an underlying buffer layer and an n-type GaN layer. The second semiconductor layer 12 includes e.g. a p-type GaN layer and a light emitting layer (active layer) 13. The light emitting layer 13 can be made of a material emitting e.g. blue, violet, blue-violet, or ultraviolet light.

The second surface of the semiconductor layer 15 is processed into a shape including a protrusion and a depression. The protrusion includes the light emitting layer 13. On the surface of the second semiconductor layer 12 constituting the surface of the protrusion, a p-side electrode 16 is provided. That is, the p-side electrode 16 is provided on the second surface in a region including the light emitting layer 13.

At the second surface of the semiconductor layer 15 beside the protrusion, a region not including the light emitting layer 13 is provided. On the surface of the first semiconductor layer 11 in that region, an n-side electrode 17 is provided. That is, the n-side electrode 17 is provided on the second surface in the region not including the light emitting layer 13.

Figure 18A:
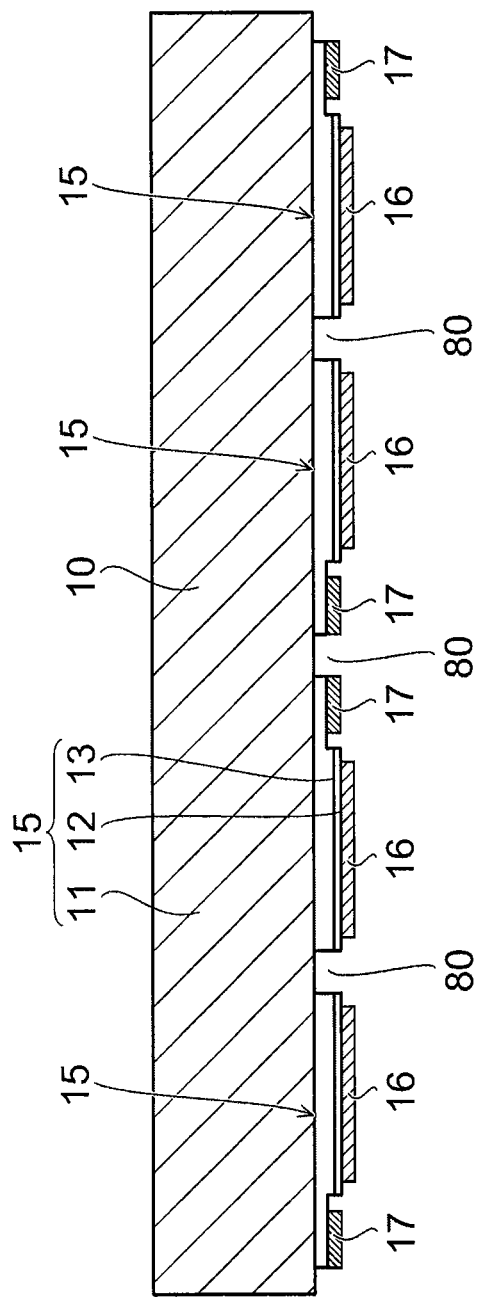
Figure 18B:
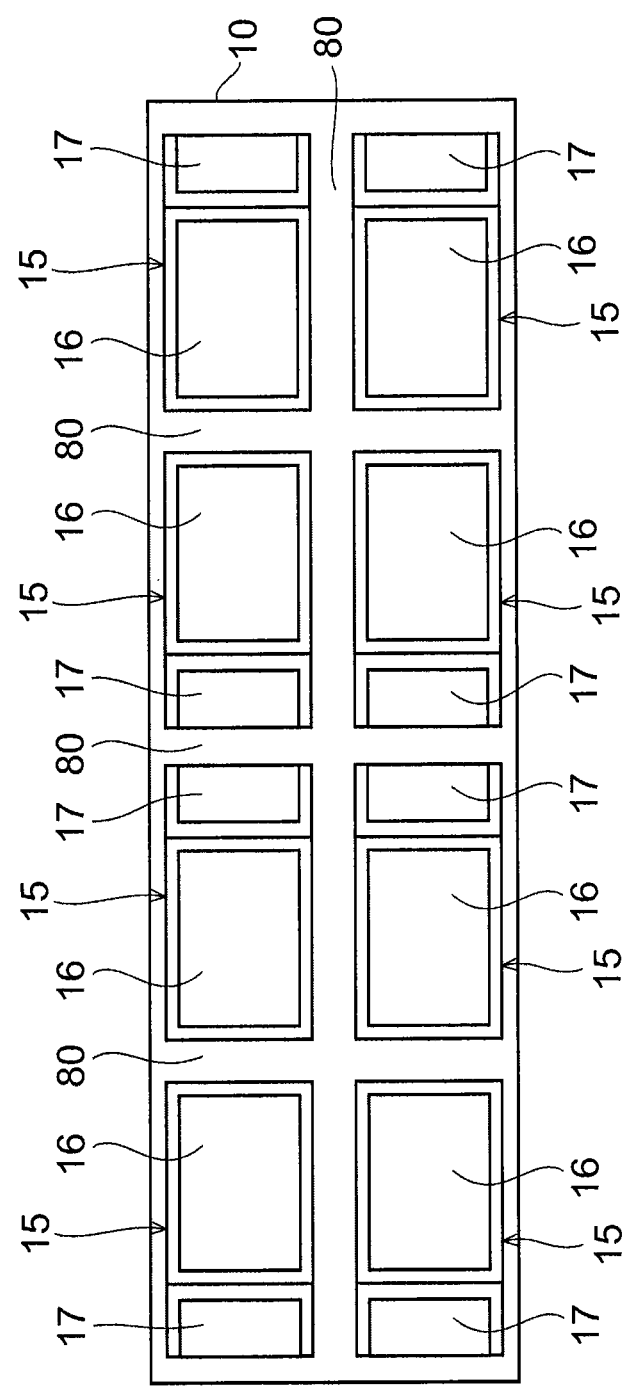

As shown in FIG. 18B being a plan view of the semiconductor layer 15 on the second surface side, the p-side electrode 16 provided on the region including the light emitting layer 13 has a larger area than the n-side electrode 17 provided on the region not including the light emitting layer 13. Thus, a large light emitting region is obtained. Here, the layout of the p-side electrode 16 and the n-side electrode 17 shown in FIG. 18B is only an example, and is not limited thereto.

On the second surface side of the semiconductor layer 15, a first insulating film (hereinafter simply referred to as insulating film) 18 is provided. The insulating film 18 covers the semiconductor layer 15, the p-side electrode 16, and the n-side electrode 17. Furthermore, the insulating film 18 covers and protects the side surface of the light emitting layer 13 and the second semiconductor layer 12.

Here, another insulating film (e.g., silicon oxide film) may be provided between the insulating film 18 and the semiconductor layer 15. The insulating film 18 is made of a resin such as polyimide having high patternability for fine openings. Alternatively, the insulating film 18 may be made of inorganic film such as silicon oxide film and silicon nitride film.

The insulating film 18 is not provided on the first surface 15*a* of the semiconductor layer 15. The insulating film 18 covers and protects the side surface 15*c* of the semiconductor layer 15 continuing from the first surface 15*a*.

On the surface of the insulating film 18 on the opposite side from the second surface of the semiconductor layer 15, a p-side wiring layer 21 and an n-side wiring layer 22 are provided and spaced from each other.

In the insulating film 18, a plurality of first openings 18*a* reaching the p-side electrode 16 is formed. Through a plurality of first vias 21*a* provided in the first openings 18*a*, the p-side wiring layer 21 is electrically connected to the p-side electrode 16.

In the insulating film 18, a second opening 18*b* reaching the n-side electrode 17 is formed. Through a second via 22*a* provided in the second opening 18*b*, the n-side wiring layer 22 is electrically connected to the n-side electrode 17.

On the surface of the p-side wiring layer 21 on the opposite side from the p-side electrode 16, a p-side metal pillar 23 is provided. The p-side wiring layer 21, the p-side metal pillar 23, and the metal film 19 used as a seed layer described later constitute a p-side wiring section in this embodiment.

On the surface of the n-side wiring layer 22 on the opposite side from the n-side electrode 17, an n-side metal pillar 24 is provided. The n-side wiring layer 22, the n-side metal pillar 24, and the metal film 19 used as a seed layer described later constitute an n-side wiring section in this embodiment.

On the insulating film 18, for instance, a resin layer 25 is stacked as a second insulating film. The resin layer 25 covers the periphery of the p-side wiring section and the periphery of the n-side wiring section. Furthermore, the resin layer 25 is embedded between the p-side metal pillar 23 and the n-side metal pillar 24.

The side surface of the p-side metal pillar 23 and the side surface of the n-side metal pillar 24 are covered with the resin layer 25. The surface of the p-side metal pillar 23 on the opposite side from the p-side wiring layer 21 is exposed from the resin layer 25 and functions as a p-side external terminal 23*a*. The surface of the n-side metal pillar 24 on the opposite side from the n-side wiring layer 22 is exposed from the resin layer 25 and functions as an n-side external terminal 24*a*.

The p-side external terminal 23*a* and the n-side external terminal 24*a* are bonded via e.g. solder 40 to the pads 72 formed on the mounting substrate 70 shown in FIGS. 6A to 6C described above.

The distance between the p-side external terminal 23*a* and the n-side external terminal 24*a* exposed at the same surface (the lower surface in FIG. 10) of the resin layer 25 is larger than the distance between the p-side wiring layer 21 and the n-side wiring layer 22 on the insulating film 18. The p-side external terminal 23*a* and the n-side external terminal 24*a* are separated by such a distance as to avoid short circuit to each other by e.g. solder at the time of mounting onto the mounting substrate.

The p-side wiring layer 21 can be brought close to the n-side wiring layer 22 up to the process limit. Thus, the area of the p-side wiring layer 21 can be expanded. This can expand the contact area between the p-side wiring layer 21 and the p-side electrode 16. Thus, the current distribution and the heat dissipation can be improved.

The area in which the p-side wiring layer 21 is in contact with the p-side electrode 16 through a plurality of first vias 21*a* is larger than the area in which the n-side wiring layer 22 is in contact with the n-side electrode 17 through the second via 22*a*. This improves the distribution of current to the light emitting layer 13, and can improve the heat dissipation of the light emitting layer 13.

The area of the n-side wiring layer 22 extending on the insulating film 18 is larger than the area in which the n-side wiring layer 22 is in contact with the n-side electrode 17.

According to the embodiment, the light emitting layer 13 is formed over a larger region than the n-side electrode 17. This can achieve high optical output. Furthermore, the n-side electrode 17 provided in a region smaller than the region including the light emitting layer 13 is extracted to the mounting surface side as an n-side wiring layer 22 having a larger area.

The first semiconductor layer 11 is electrically connected to the n-side metal pillar 24 including the n-side external terminal 24a via the n-side electrode 17, the metal film 19, and the n-side wiring layer 22. The second semiconductor layer 12 including the light emitting layer 13 is electrically connected to the p-side metal pillar 23 including the p-side external terminal 23a via the p-side electrode 16, the metal film 19, and the p-side wiring layer 21.

The p-side metal pillar 23 is thicker than the p-side wiring layer 21. The n-side metal pillar 24 is thicker than the n-side wiring layer 22. Each thickness of the p-side metal pillar 23, the n-side metal pillar 24, and the resin layer 25 is thicker than the semiconductor layer 15. Here, the term "thickness" used herein refers to the thickness in the vertical direction in FIG. 10.

Each thickness of the p-side metal pillar 23 and the n-side metal pillar 24 is greater than the thickness of the stacked body including the semiconductor layer 15, the p-side electrode 16, the n-side electrode 17, and the insulating film 18. Here, the aspect ratio (the ratio of thickness to planar size) of each metal pillar 23, 24 is not limited to 1 or more, but may be less than 1. That is, the metal pillar 23, 24 may have a smaller thickness than its planar size.

According to the embodiment, even if the after-mentioned substrate 10 used to form the semiconductor layer 15 is removed, the support body including the p-side metal pillar 23, the n-side metal pillar 24, and the resin layer 25 stably supports the semiconductor layer 15. This can increase the mechanical strength of the semiconductor light emitting device 1d.

The material of the p-side wiring layer 21, the n-side wiring layer 22, the p-side metal pillar 23, and the n-side metal pillar 24 can be e.g. copper, gold, nickel, or silver. Among them, copper achieves good thermal conductivity, high migration resistance, and good adhesiveness to insulating material.

The resin layer 25 reinforces the p-side metal pillar 23 and the n-side metal pillar 24. Preferably, the thermal expansion coefficient of the resin layer 25 is equal or close to that of the mounting substrate. Such a resin layer 25 can be made of e.g. epoxy resin, silicone resin, or fluororesin.

Furthermore, in the state of the semiconductor light emitting device 1d mounted on the mounting substrate via the p-side external terminal 23a and the n-side external terminal 24a, the stress applied to the semiconductor layer 15 via solder can be absorbed and relaxed by the p-side metal pillar 23 and the n-side metal pillar 24.

The p-side wiring section including the p-side wiring layer 21 and the p-side metal pillar 23 is connected to the p-side electrode 16 through a plurality of vias 21a separated from each other. Thus, high stress relaxation effect is achieved by the p-side wiring section.

Figure 11A:
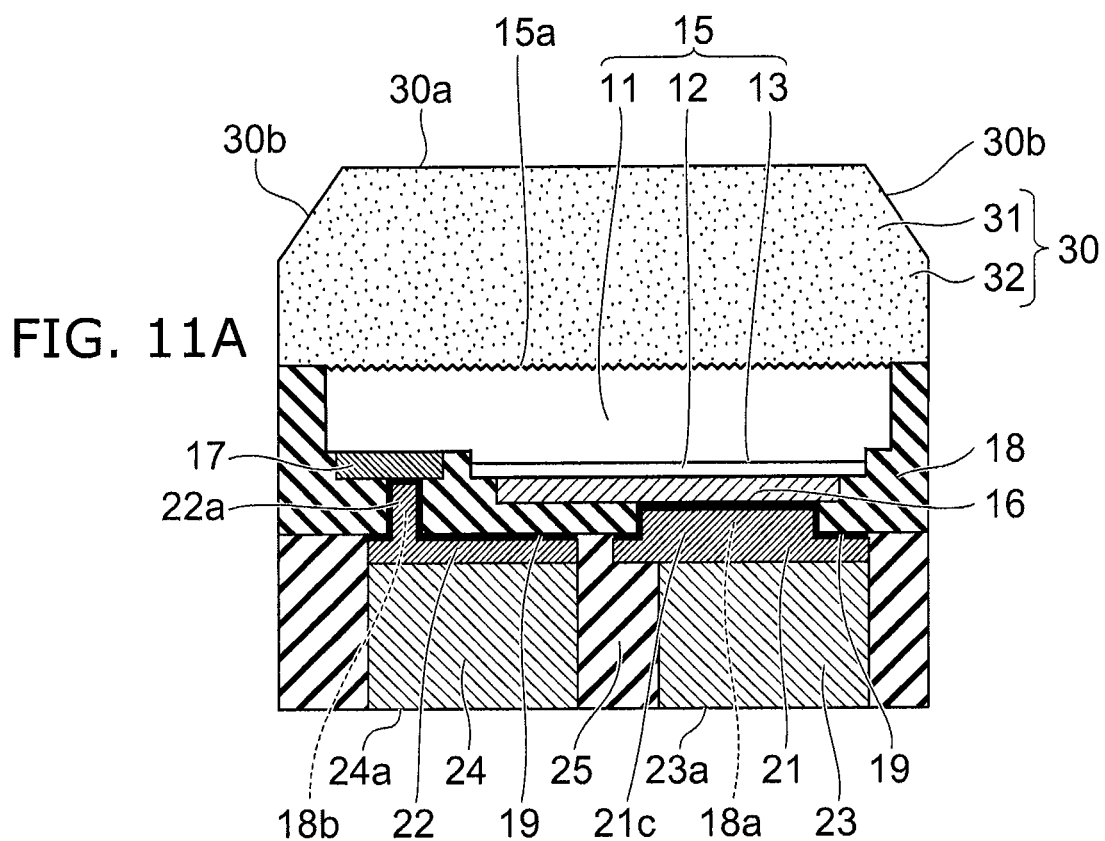
FIG. 11A is a schematic sectional view of a semiconductor light emitting device of a variation of the semiconductor light emitting device of the fourth embodiment.

Alternatively, as shown in FIG. 11A, the p-side wiring layer 21 may be connected to the p-side electrode 16 through a via 21c provided in one large first opening 18a and having a larger planar size than the via 21a. In this case, heat dissipation of the light emitting layer 13 can be improved through the p-side electrode 16, the p-side wiring layer 21, and the p-side metal pillar 23, all made of metal.

As described later, the substrate 10 used to form the semiconductor layer 15 is removed from above the first surface 15a. This can reduce the profile of the semiconductor light emitting device 1d.

At the first surface 15a of the semiconductor layer 15, a fine unevenness is formed. For instance, wet etching (frost treatment) with alkali solution is performed on the first surface 15a to form the unevenness. By providing an unevenness at the first surface 15a, light incident on the first surface 15a with various angles can be extracted to the outside of the first surface 15a without total reflection.

On the first surface 15a, a phosphor layer 30 is provided. The phosphor layer 30 includes a transparent resin 31 as a transparent medium, and a plurality of phosphor particles 32 dispersed in the transparent resin 31.

The transparent resin 31 is transparent to the excitation light of the light emitting layer 13 and the fluorescence of the phosphor 32. The transparent resin 31 can be made of e.g. silicone resin, acrylic resin, or phenyl resin.

The phosphor 32 can absorb the excitation light of the light emitting layer 13 and emit wavelength converted light. Thus, the semiconductor light emitting device 1d can emit mixed light of the excitation light of the light emitting layer 13 and the wavelength converted light of the phosphor 32.

For instance, the phosphor 32 can be a yellow phosphor emitting yellow light. Then, for instance, white color or light bulb color can be obtained as a mixed color of blue light of the light emitting layer 13 made of GaN-based material and yellow light being the wavelength converted light of the phosphor 32. Here, the phosphor layer 30 may be configured to include a plurality of kinds of phosphors (e.g., a red phosphor emitting red light and a green phosphor emitting green light).

Also in this embodiment, the angle between the upper surface 30a and the side surface of the phosphor layer 30 is formed not at a right angle but at an obtuse angle. Thus, as in the first embodiment shown in FIGS. 1A and 1B, the oblique surface 30b is formed in the end portion of the phosphor layer 30.

Thus, the semiconductor light emitting device 1d of the fourth embodiment can also suppress light distribution disturbance due to optical vignetting at the angle of the phosphor layer 30. Furthermore, the optical component emitted upward in the end portion of the semiconductor layer 15 increases. This can increase the lighting fixture efficacy.

The thickness of the phosphor layer 30 on the side of the end portion of the semiconductor layer 15 is thinner than the thickness of the phosphor layer 30 on the side of the center of the first surface 15a. This increases the excitation light emission component to the lateral direction, and can alleviate color breakup.

Furthermore, in a light emitting module with a plurality of semiconductor light emitting devices 1d mounted on a mounting substrate, the laterally emitted light is reflected upward by the oblique surface 30b of the phosphor layer 30 of the adjacent semiconductor light emitting device 1d to increase upward light emission efficiency. As a result, a plurality of semiconductor light emitting devices 1d can be densely mounted with a reduced distance to each other. Thus, the power density can be increased.

Next, with reference to FIGS. 15A to 26B, a method for manufacturing the above semiconductor light emitting device 1d is described. FIGS. 15A to 26B show a partial region in the wafer state.

FIG. 15A shows a stacked body in which a first semiconductor layer 11 and a second semiconductor layer 12 are formed on the major surface (the lower surface in FIG. 15A) of a substrate 10. FIG. 15B corresponds to a bottom view in FIG. 15A.

A first semiconductor layer 11 is formed on the major surface of a substrate 10. A second semiconductor layer 12 including a light emitting layer 13 is formed thereon. The first semiconductor layer 11 and the second semiconductor layer 12 containing gallium nitride can be crystal grown on e.g. a sapphire substrate by the MOCVD (metal organic chemical vapor deposition) method. Alternatively, a silicon substrate can also be used as the substrate 10.

The surface of the first semiconductor layer 11 in contact with the substrate 10 is a first surface 15a of the semiconductor layer 15. The surface of the second semiconductor layer 12 is a second surface 15b of the semiconductor layer 15.

Next, by e.g. the RIE (reactive ion etching) method using a resist, not shown, a trench 80 penetrating through the semiconductor layer 15 to the substrate 10 is formed as shown in FIG. 16A and its bottom view, FIG. 16B. The trench 80 is formed like a lattice on the substrate 10 in the wafer state and separates the semiconductor layer 15 into a plurality of chips on the substrate 10.

Here, the step of separating the semiconductor layer 15 into a plurality may be performed after selectively removing the second semiconductor layer 12 or forming electrodes described later.

Next, by e.g. the RIE method using a resist, not shown, part of the second semiconductor layer 12 is removed as shown in FIG. 17A and its bottom view, FIG. 17B. Thus, part of the first semiconductor layer 11 is exposed. The region where the first semiconductor layer 11 is exposed does not include the light emitting layer 13.

Next, as shown in FIG. 18A and its bottom view, FIG. 18B, a p-side electrode 16 and an n-side electrode 17 are formed on the second surface of the semiconductor layer 15. The p-side electrode 16 is formed on the surface of the second semiconductor layer 12. The n-side electrode 17 is formed on the exposed surface of the first semiconductor layer 11.

The p-side electrode 16 and the n-side electrode 17 are formed by e.g. the sputtering method or evaporation method. Either the p-side electrode 16 or the n-side electrode 17 may be formed first. The p-side electrode 16 and the n-side electrode 17 may be simultaneously formed from the same material.

The p-side electrode 16 contains e.g. silver, silver alloy, aluminum, or aluminum alloy having reflectivity to the emission light of the light emitting layer 13. The p-side electrode 16 may be configured to include a metal protective film (barrier metal) to prevent sulfuration and oxidation of the p-side electrode 16.

Furthermore, between the p-side electrode 16 and the n-side electrode 17 and on the end surface (side surface) of the light emitting layer 13, for instance, a silicon nitride film or silicon oxide film may be formed as a passivation film by the CVD (chemical vapor deposition) method. Furthermore, for instance, activation annealing for forming ohmic contact between each electrode and the semiconductor layer is performed as necessary.

Next, the exposed portion on the major surface of the substrate 10 is entirely covered with an insulating film 18 shown in FIG. 19A. Then, the insulating film 18 is patterned by e.g. wet etching. Thus, first openings 18a and a second opening 18b are selectively formed in the insulating film 18.

The first openings 18a are formed in a plurality. Each first opening 18a reaches the p-side electrode 16. The second opening 18b reaches the n-side electrode 17.

The insulating film 18 can be made of an organic material such as photosensitive polyimide and benzocyclobutene. In this case, the insulating film 18 can be directly subjected to light exposure and development without using a resist.

Alternatively, the insulating film 18 may be made of an inorganic film such as silicon nitride film and silicon oxide film. In the case where the insulating film 18 is an inorganic film, the first openings 18a and the second opening 18b are formed by patterning a resist formed on the insulating film 18 followed by etching.

Next, as shown in FIG. 19B, a metal film 19 is formed on the surface of the insulating film 18, the inner wall (sidewall and bottom) of the first openings 18a, and the inner wall (sidewall and bottom) of the second opening 18b. The metal film 19 is used as a seed metal for plating described later.

The metal film 19 is formed by e.g. the sputtering method. The metal film 19 includes e.g. a stacked film of titanium (Ti) and copper (Cu) stacked sequentially from the insulating film 18 side. Alternatively, an aluminum film may be used instead of the titanium film.

Next, as shown in FIG. 19C, a resist 91 is selectively formed on the metal film 19. With the metal film 19 used as a current path, Cu electrolytic plating is performed.

Figure 20A:
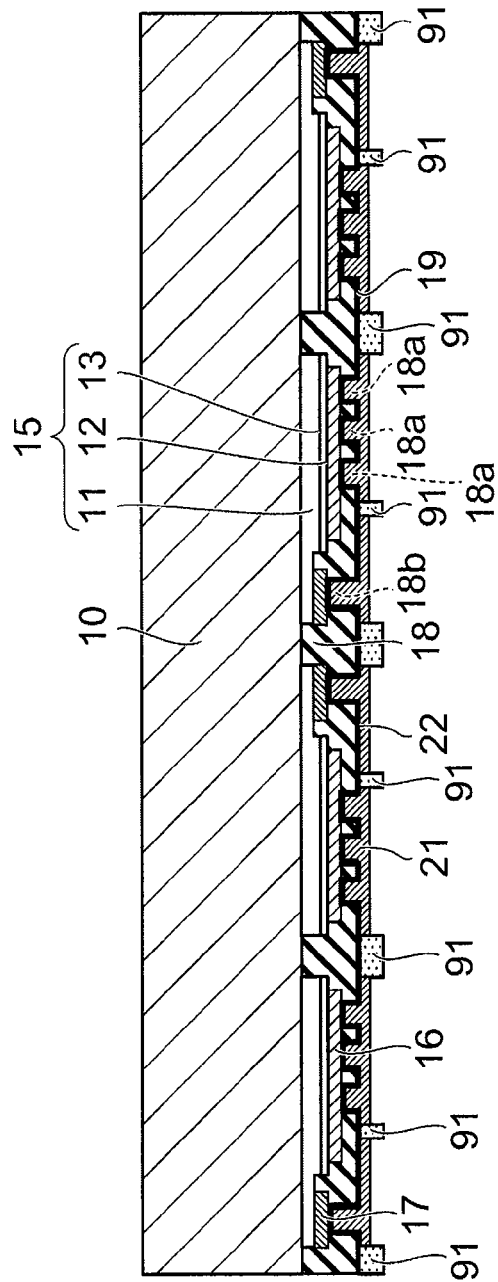
Figure 20B:
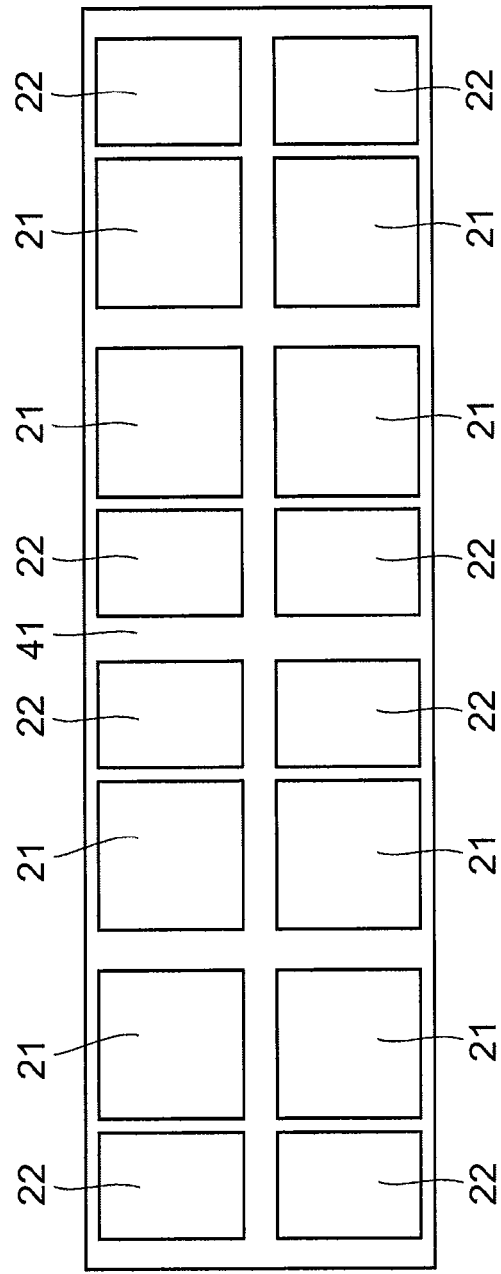

Thus, as shown in FIG. 20A and its bottom view, FIG. 20B, a p-side wiring layer 21 and an n-side wiring layer 22 are selectively formed on the metal film 19. The p-side wiring layer 21 and the n-side wiring layer 22 are made of e.g. a copper material simultaneously formed by the plating method.

The p-side wiring layer 21 is formed also in the first openings 18a, and electrically connected to the p-side electrode 16 via the metal film 19. The n-side wiring layer 22 is formed also in the second opening 18b, and electrically connected to the n-side electrode 17 via the metal film 19.

The resist 91 used for the plating of the p-side wiring layer 21 and the n-side wiring layer 22 is removed using a solvent or oxygen plasma.

Figures 21A, 21B:
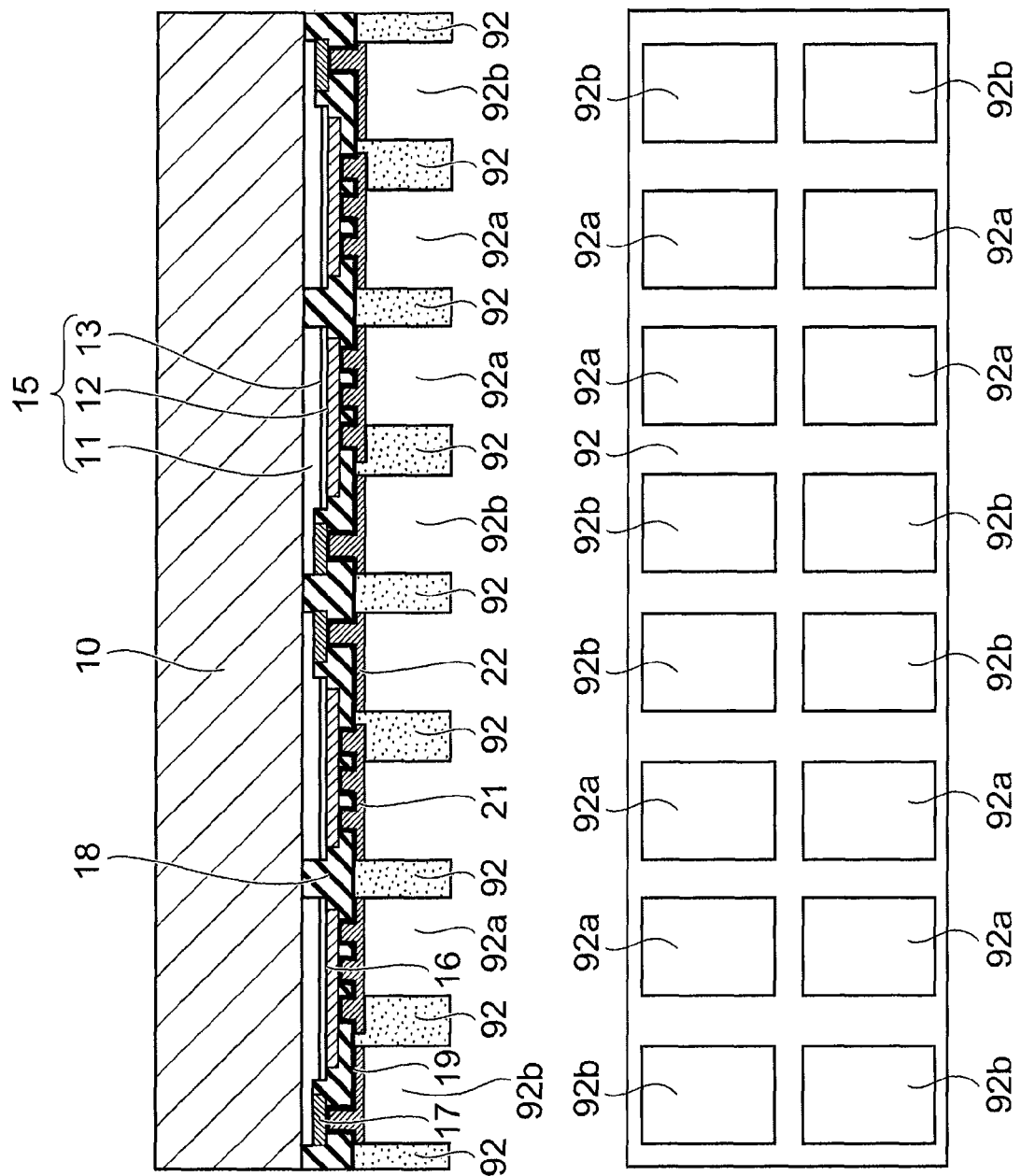

Next, as shown in FIG. 21A and its bottom view, FIG. 21B, a resist 92 for metal pillar formation is formed. The resist 92 is thicker than the aforementioned resist 91. Here, the resist 91 may be left instead of being removed in the previous step, and the resist 92 may be overlaid on the resist 91. In the resist 92, a first opening 92a and a second opening 92b are formed.

Figures 22A, 22B:
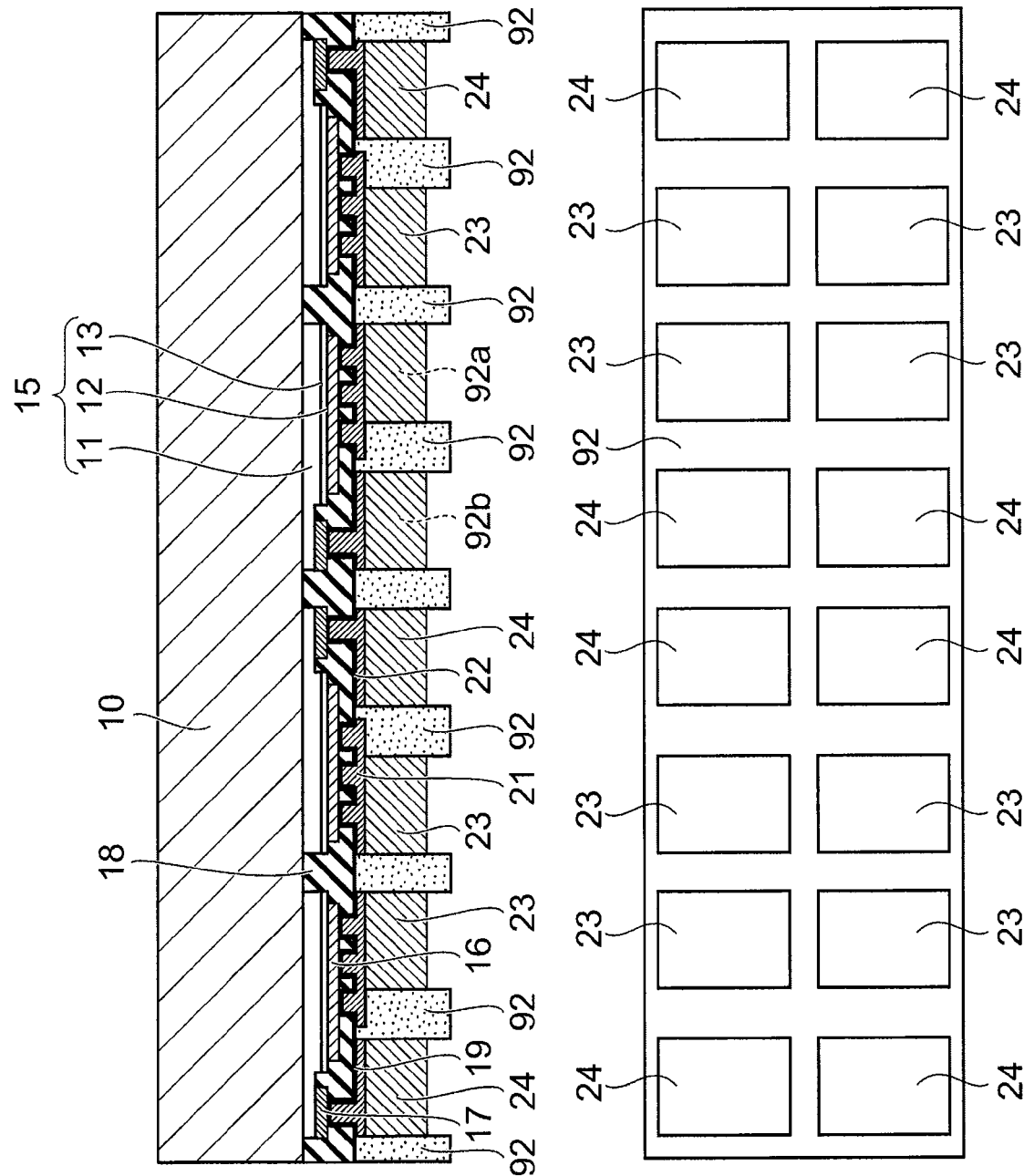

Then, the resist 92 is used as a mask to perform Cu electrolytic plating with the metal film 19 used as a current path. Thus, as shown in FIG. 22A and its bottom view, FIG. 22B, a p-side metal pillar 23 and an n-side metal pillar 24 are formed.

The p-side metal pillar 23 is formed on the surface of the p-side wiring layer 21 in the first opening 92a formed in the resist 92. The n-side metal pillar 24 is formed on the surface of the n-side wiring layer 22 in the second opening 92b formed in the resist 92. The p-side metal pillar 23 and the n-side metal pillar 24 are made of e.g. a copper material simultaneously formed by the plating method.

As shown in FIG. 23A, the resist 92 is removed using e.g. a solvent or oxygen plasma. Then, the p-side metal pillar 23, the n-side metal pillar 24, the p-side wiring layer 21, and the n-side wiring layer 22 are used as a mask to remove the exposed portion of the metal film 19 by wet etching. Thus, as shown in FIG. 23B, the electrical connection between the p-side wiring layer 21 and the n-side wiring layer 22 via the metal film 19 is broken.

Figure 24A:
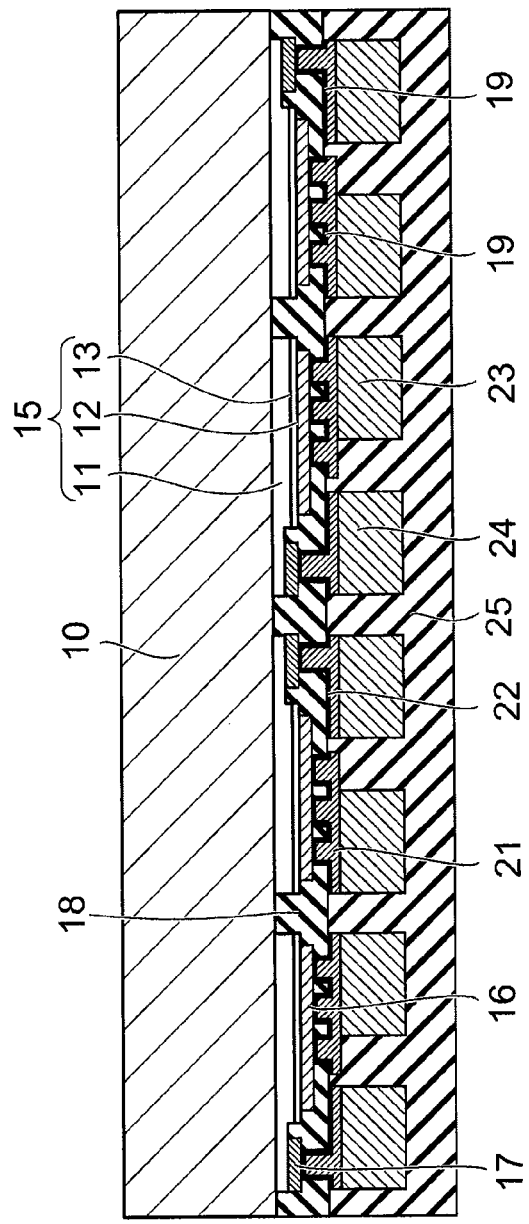

Next, as shown in FIG. 24A, a resin layer 25 is stacked on the insulating film 18. The resin layer 25 covers the p-side wiring layer 21, the n-side wiring layer 22, the p-side metal pillar 23, and the n-side metal pillar 24.

The resin layer 25 has insulation property. Furthermore, for instance, carbon black may be contained in the resin layer 25. Thus, light blocking property against the emission light of the light emitting layer 13 may be imparted to the resin layer 25.

Figure 24B:
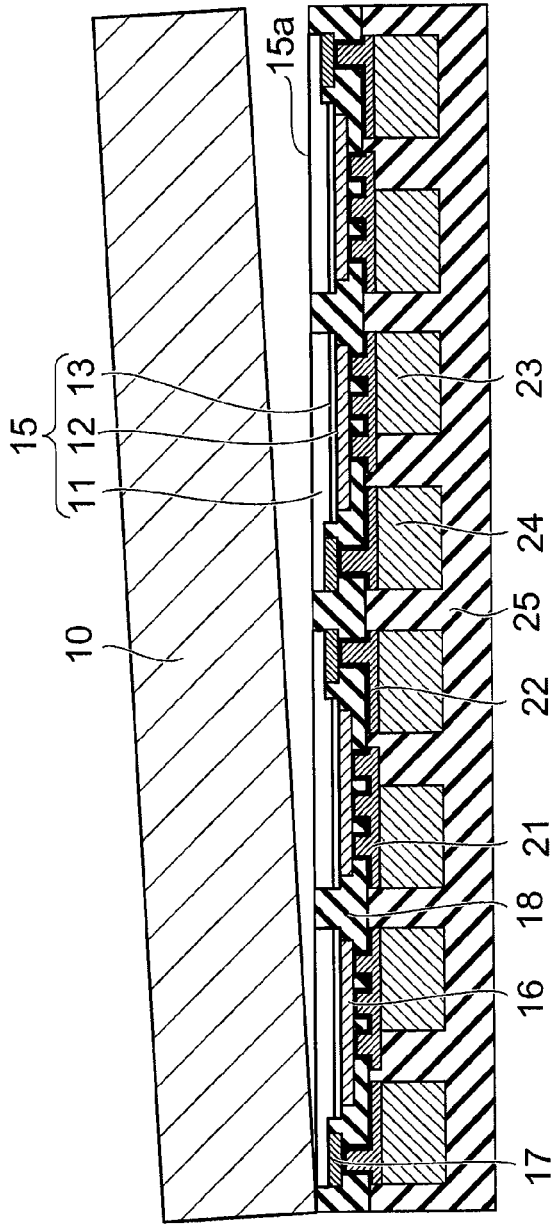

Next, as shown in FIG. 24B, the substrate 10 is removed. In the case where the substrate 10 is a sapphire substrate, the substrate 10 can be removed by e.g. the laser lift-off method. Specifically, laser light is applied from the rear surface side of the substrate 10 toward the first semiconductor layer 11. The laser light can be transmitted through the substrate 10, and has a wavelength in the absorption region of the first semiconductor layer 11.

When the laser light reaches the interface between the substrate 10 and the first semiconductor layer 11, the first semiconductor layer 11 near the interface is decomposed by absorbing the energy of the laser light. The first semiconductor layer 11 is decomposed into gallium (Ga) and nitrogen gas. By this decomposition reaction, a small gap is formed between the substrate 10 and the first semiconductor layer 11. Thus, the substrate 10 and the first semiconductor layer 11 are separated.

The laser light irradiation is performed a plurality of times throughout the wafer, once for each predefined region. Thus, the substrate 10 is removed.

In the case where the substrate 10 is a silicon substrate, the substrate 10 can be removed by etching.

The aforementioned stacked body formed on the major surface of the substrate 10 is reinforced by the p-side metal pillar 23, the n-side metal pillar 24, and the resin layer 25 thicker than the semiconductor layer 15. Thus, even if the substrate 10 is eliminated, the wafer state can be maintained.

The resin layer 25, and the metal constituting the p-side metal pillar 23 and the n-side metal pillar 24 are both softer materials than the semiconductor layer 15. The semiconductor layer 15 is supported by such a soft support body. This can avoid destruction of the semiconductor layer 15 even if the large internal stress produced by epitaxial growth of the semiconductor layer 15 on the substrate 10 is released at once when the substrate 10 is removed.

After the substrate 10 is removed, the first surface 15a of the semiconductor layer 15 is cleaned. For instance, gallium (Ga) attached to the first surface 15a is removed by e.g. dilute hydrofluoric acid.

Then, for instance, the first surface 15a is wet etched with e.g. KOH (potassium hydroxide) solution or TMAH (tetramethylammonium hydroxide). Thus, by the difference in etching rate depending on the crystal surface orientation, as shown in FIG. 25A, an unevenness is formed at the first surface 15a. Alternatively, an unevenness may be formed at the first surface 15a by patterning with a resist followed by etching. The unevenness formed at the first surface 15a can increase the light extraction efficiency.

Next, as shown in FIG. 25B, a phosphor layer 30 is formed on the first surface 15a. The phosphor layer 30 is formed also on the insulating film 18 between the adjacent semiconductor layers 15.

A liquid transparent resin 31 dispersed with phosphor 32 is supplied onto the first surface 15a by such a method as printing, potting, molding, and compression molding, and then heat-cured.

Next, the surface (the lower surface in FIG. 25B) of the resin layer 25 is ground. Thus, as shown in FIG. 26A and its bottom view, FIG. 26B, a p-side external terminal 23a and an n-side external terminal 24a are exposed.

Then, the phosphor layer 30, the insulating film 18, and the resin layer 25 are cut at the position of the aforementioned trench 80 and singulated into a plurality of semiconductor light emitting devices id.

Also in this embodiment, a blade having a V-shaped cross section is used to cut the phosphor layer 30 from its upper surface 30a side. Thus, an oblique surface 30b can be formed on the phosphor layer 30.

At the time of dicing, the substrate 10 has already been removed. Furthermore, the semiconductor layer 15 does not exist in the trench 80. This can avoid damage to the semiconductor layer 15 at the time of dicing. Furthermore, without any additional step after singulation, a structure with the end portion (side surface) of the semiconductor layer 15 covered and protected with the insulating film 18 is obtained.

Here, the singulated semiconductor light emitting device 1d may have a single chip structure including one semiconductor layer 15, or a multi-chip structure including a plurality of semiconductor layers 15.

The above steps before dicing are performed collectively in the wafer state. Thus, there is no need to perform wiring and packaging for each singulated device. This can significantly reduce the production cost. That is, in the singulated state, wiring and packaging have already been finished. This can improve productivity. As a result, cost reduction is facilitated.

Fifth Embodiment

Figure 11B:
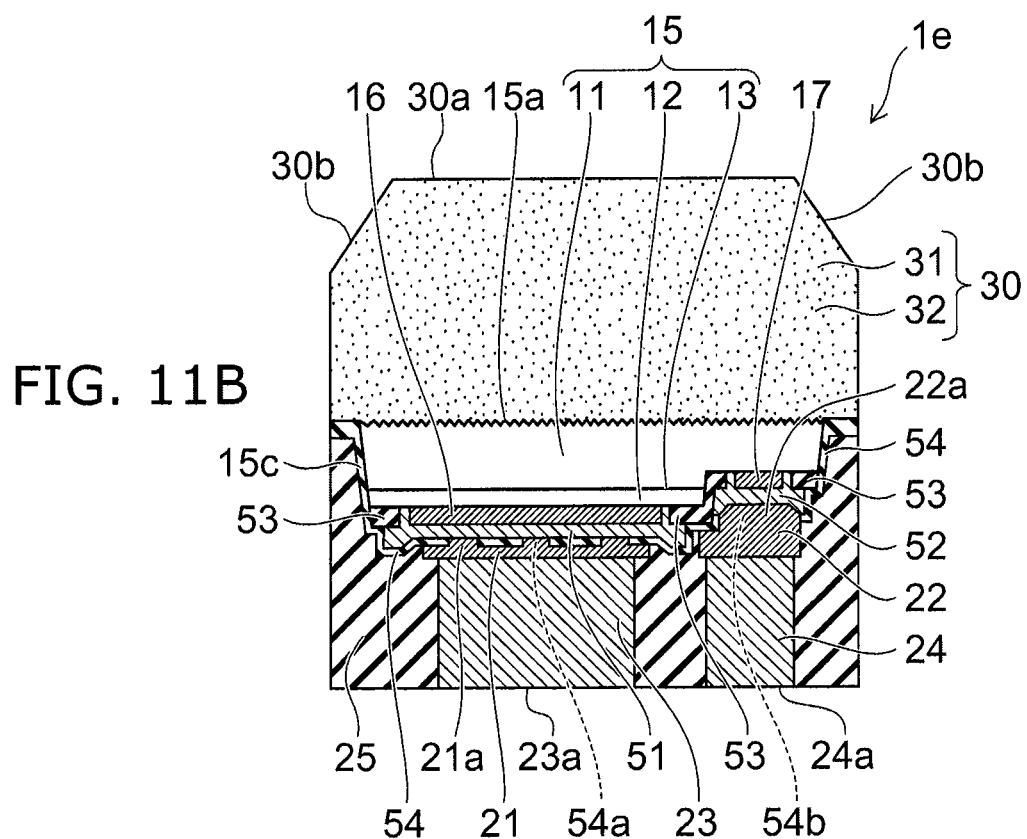
FIG. 11B is a schematic sectional view of a semiconductor light emitting device of a fifth embodiment.

Next, FIG. 11B is a schematic sectional view of a semiconductor light emitting device 1e of a fifth embodiment.

In this semiconductor light emitting device 1e, on the front surface and side surface of the p-side electrode 16, a p-side pad 51 covering the p-side electrode 16 is provided. The p-side electrode 16 contains at least one of e.g. nickel (Ni), gold (Au), and rhodium (Rh) capable of forming an alloy with gallium (Ga) contained in the semiconductor layer 15. The p-side pad 51 has higher reflectance to the emission light of the light emitting layer 13 than the p-side electrode 16. The p-side pad 51 contains e.g. silver (Ag) as a major component. The p-side pad 51 protects the p-side electrode 16 against oxidation and corrosion.

Furthermore, on the front surface and side surface of the n-side electrode 17, an n-side pad 52 covering the n-side electrode 17 is provided. The n-side pad 52 contains at least one of e.g. nickel (Ni), gold (Au), and rhodium (Rh) capable of forming an alloy with gallium (Ga) contained in the semiconductor layer 15. The n-side pad 52 has higher reflectance to the emission light of the light emitting layer 13 than the n-side electrode 17. The n-side pad 52 contains e.g. silver (Ag) as a major component. The n-side pad 52 protects the n-side electrode 17 against oxidation and corrosion.

On the second surface of the semiconductor layer 15, an insulating film 53 such as silicon oxide film and silicon nitride film is provided around the p-side electrode 16 and around the n-side electrode 17. The insulating film 53 is provided between the p-side electrode 16 and the n-side electrode 17, and between the p-side pad 51 and the n-side pad 52.

An insulating film 54 such as silicon oxide film and silicon nitride film is provided on the insulating film 53, on the p-side pad 51, and on the n-side pad 52. The insulating film 54 is provided also on the side surface 15c of the semiconductor layer 15 and covers the side surface 15c.

On the insulating film 54, a p-side wiring layer 21 and an n-side wiring layer 22 are provided. The p-side wiring layer 21 is connected to the p-side pad 51 through a first via 21a provided in a first opening 54a formed in the insulating film 54. The n-side wiring layer 22 is connected to the n-side pad 52 through a second via 22a provided in a second opening 54b formed in the insulating film 54.

Also in this structure, the p-side wiring layer 21 may be connected to the p-side pad 51 through a plurality of vias 21a separated from each other. Alternatively, the p-side wiring layer 21 may be connected to the p-side pad 51 through one via having a larger planar size than the via 21a.

On the p-side wiring layer 21, a p-side metal pillar 23 thicker than the p-side wiring layer 21 is provided. On the n-side wiring layer 22, an n-side metal pillar 24 thicker than the n-side wiring layer 22 is provided.

On the insulating film 54, a resin layer 25 is stacked. The resin layer 25 covers a p-side wiring section including the p-side wiring layer 21 and the p-side metal pillar 23, and an n-side wiring section including the n-side wiring layer 22 and the n-side metal pillar 24. However, the surface (the lower surface in the figure) of the p-side metal pillar 23 on the opposite side from the p-side wiring layer 21 is exposed from the resin layer 25 and functions as a p-side external terminal 23a. Likewise, the surface (the lower surface in the figure) of the n-side metal pillar 24 on the opposite side from the n-side wiring layer 22 is exposed from the resin layer 25 and functions as an n-side external terminal 24a.

The resin layer 25 is embedded via the insulating film 54 in the aforementioned trench 80 separating the semiconductor layer 15 into a plurality on the substrate 10. Thus, the side surface 15c of the semiconductor layer 15 is covered and protected with the insulating film 54 being an inorganic film, and the resin layer 25.

Also in this semiconductor light emitting device 1e, as in the semiconductor light emitting device 1a of the first embodiment and the semiconductor light emitting device 1d of the fourth embodiment, a phosphor layer 30 having an oblique surface 30b is provided on the first surface 15a.

Sixth Embodiment

Figure 12A:
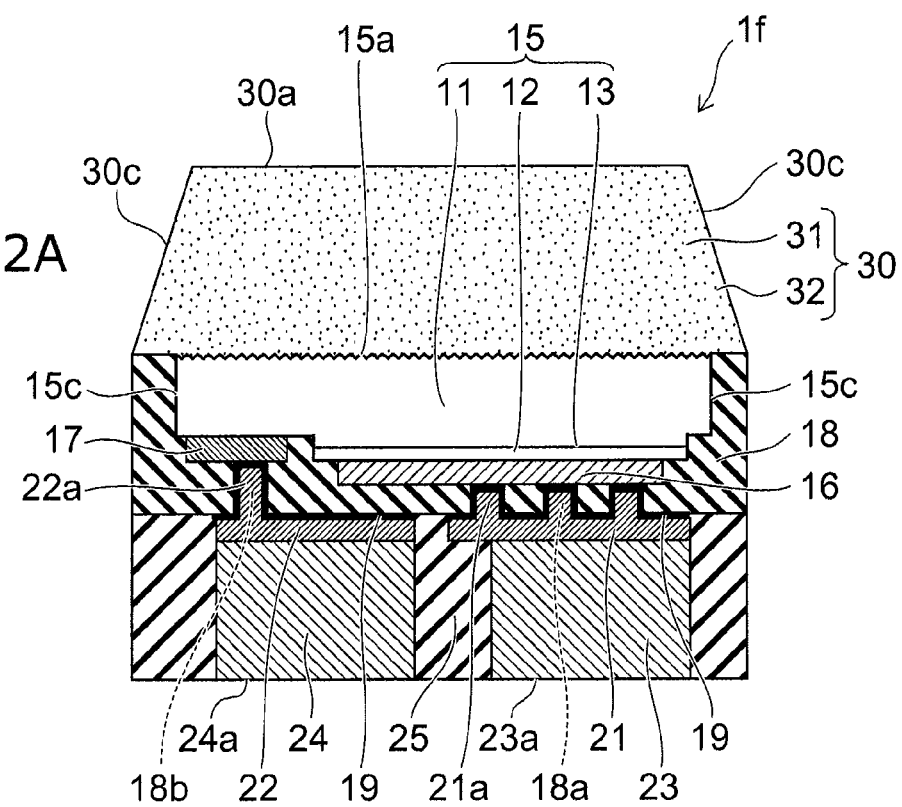
FIG. 12A is a schematic sectional view of a semiconductor light emitting device of a sixth embodiment.

FIG. 12A is a schematic sectional view of a semiconductor light emitting device 1f of a sixth embodiment.

In this semiconductor light emitting device 1f, the phosphor layer 30 of the semiconductor light emitting device 1b of the second embodiment shown in FIGS. 2A and 2B is provided on the first surface 15a in the semiconductor light emitting device 1d of the fourth embodiment shown in FIG. 10. That is, the side surface of the phosphor layer 30 is entirely an oblique surface 30c.

Figure 13A:
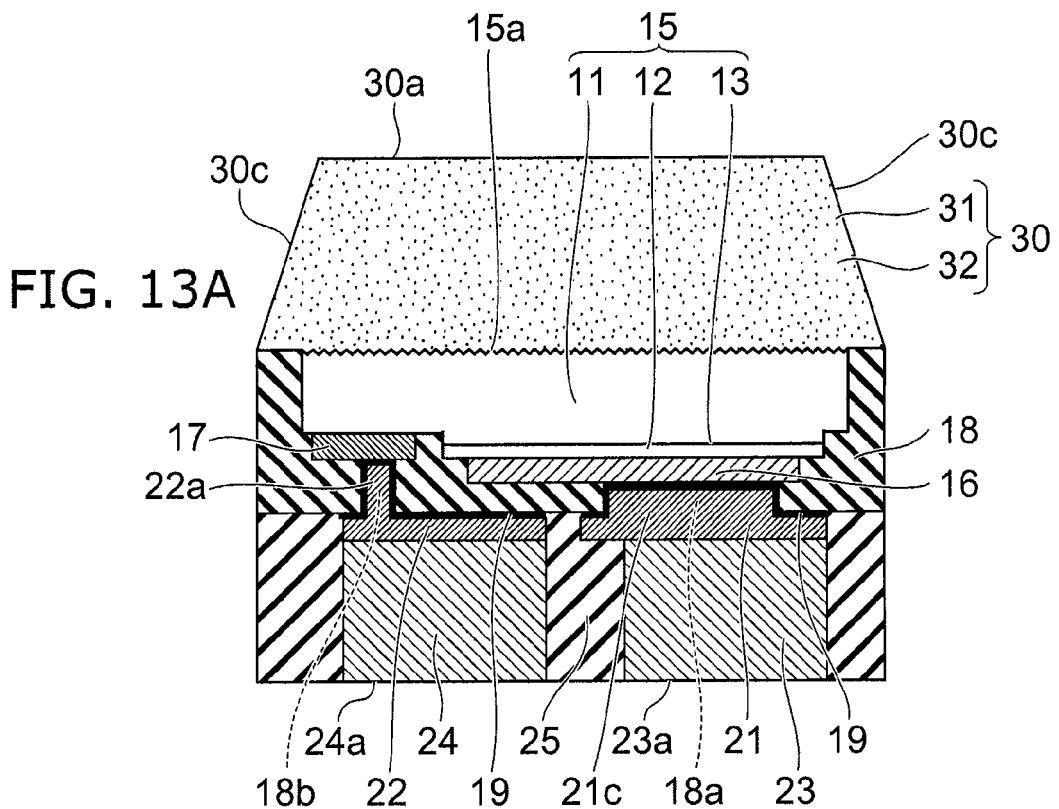
FIG. 13A is a schematic sectional view of a semiconductor light emitting device of a variation of the semiconductor light emitting device of the sixth embodiment.

Furthermore, in the semiconductor light emitting device 1f, the p-side wiring layer 21 is not limited to being connected to the p-side electrode 16 through a plurality of vias 21a separated from each other. As shown in FIG. 13A, the p-side wiring layer 21 may be connected to the p-side electrode 16 through one via 21c having a larger planar size than the via 21a.

Seventh Embodiment

Figure 12B:
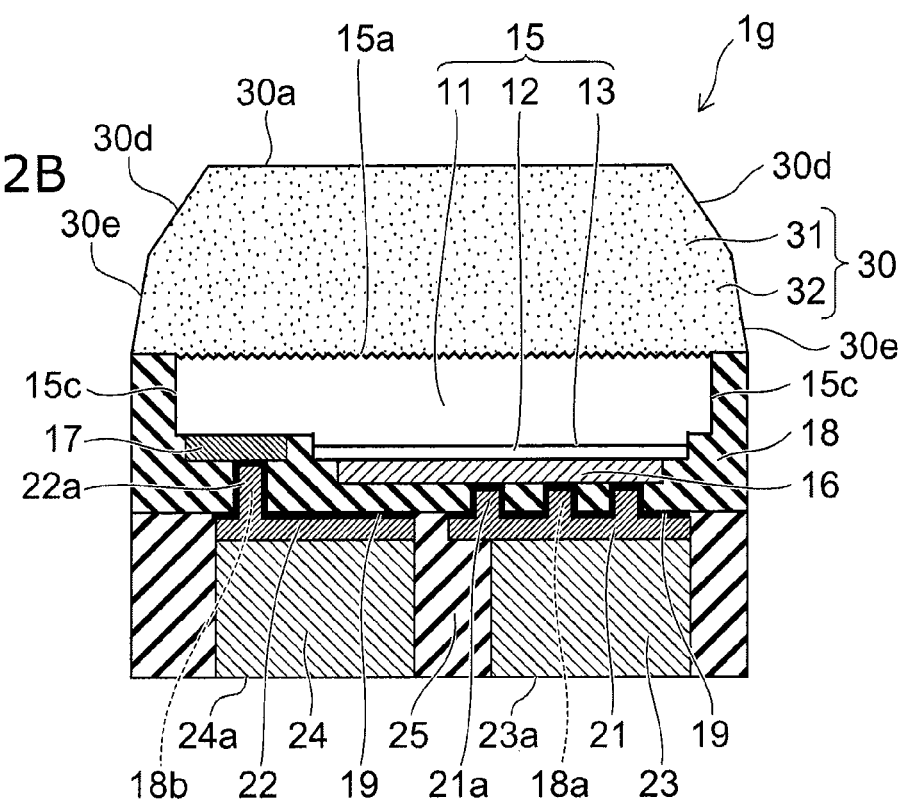
FIG. 12B is a schematic sectional view of a semiconductor light emitting device of a seventh embodiment.

FIG. 12B is a schematic sectional view of a semiconductor light emitting device 1g of a seventh embodiment.

In this semiconductor light emitting device 1g, the phosphor layer 30 of the semiconductor light emitting device 1c of the third embodiment shown in FIGS. 3A and 3B is provided on the first surface 15a in the semiconductor light emitting device 1d of the fourth embodiment shown in FIG. 10. That is, the phosphor layer 30 has two oblique surfaces 30d and 30e having different inclination angles with respect to the first surface 15a. Thus, the phosphor layer 30 can function as a lens.

Figure 14A:
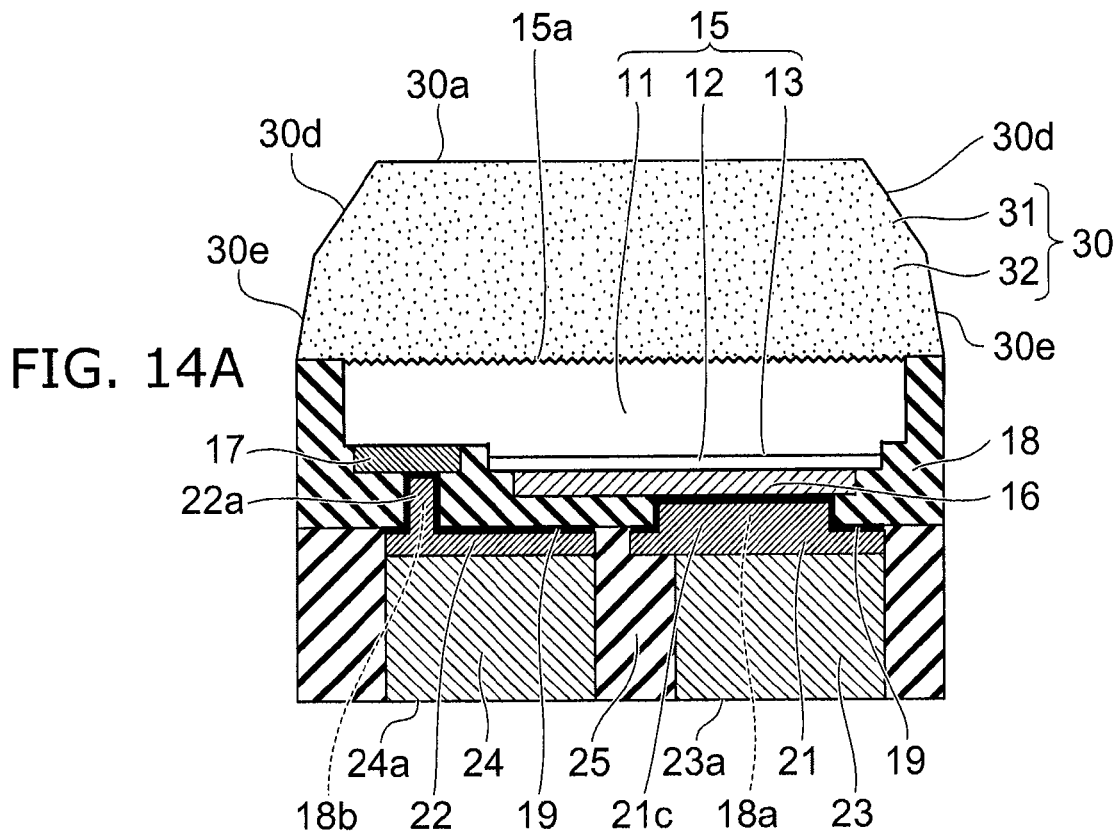
FIG. 14A is a schematic sectional view of a semiconductor light emitting device of a variation of the semiconductor light emitting device of the seventh embodiment.

Furthermore, in the semiconductor light emitting device 1g, the p-side wiring layer 21 is not limited to being connected to the p-side electrode 16 through a plurality of vias 21a separated from each other. As shown in FIG. 14A, the p-side wiring layer 21 may be connected to the p-side electrode 16 through one via 21c having a larger planar size than the via 21a.

Eighth Embodiment

Figure 13B:
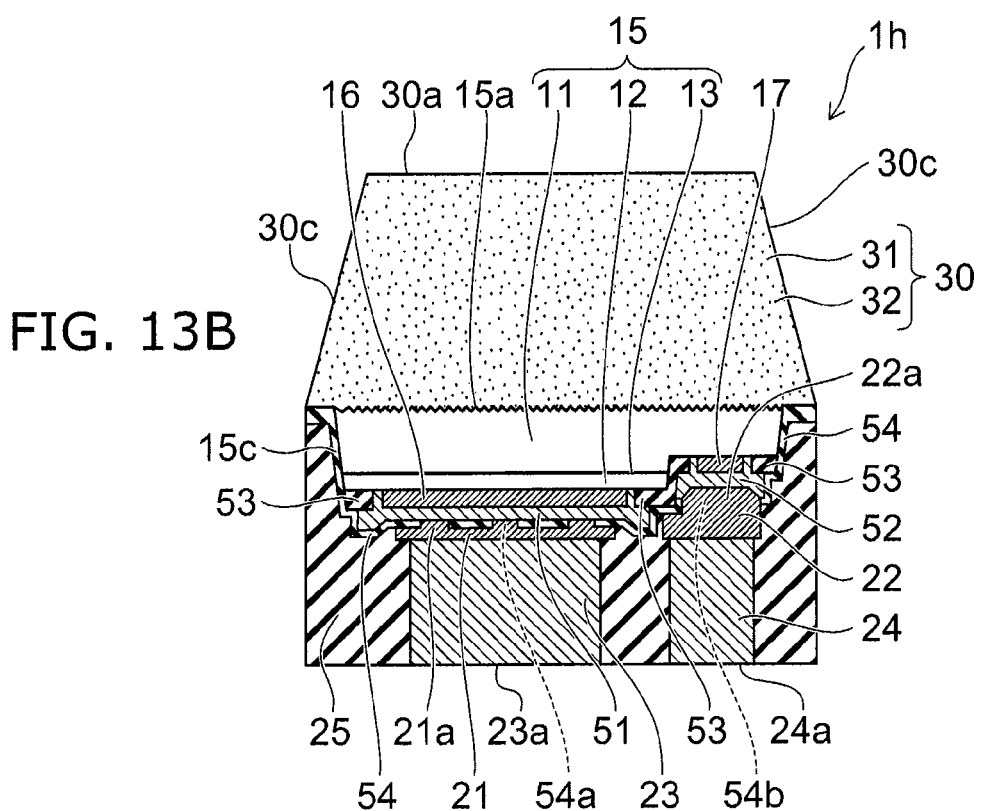
FIG. 13B is a schematic sectional view of a semiconductor light emitting device of a eighth embodiment.

FIG. 13B is a schematic sectional view of a semiconductor light emitting device 1h of an eighth embodiment.

In this semiconductor light emitting device 1h, the phosphor layer 30 of the semiconductor light emitting device 1b of the second embodiment shown in FIGS. 2A and 2B is provided on the first surface 15a in the semiconductor light emitting device 1e of the fifth embodiment shown in FIG. 11B.

Ninth Embodiment

Figure 14B:
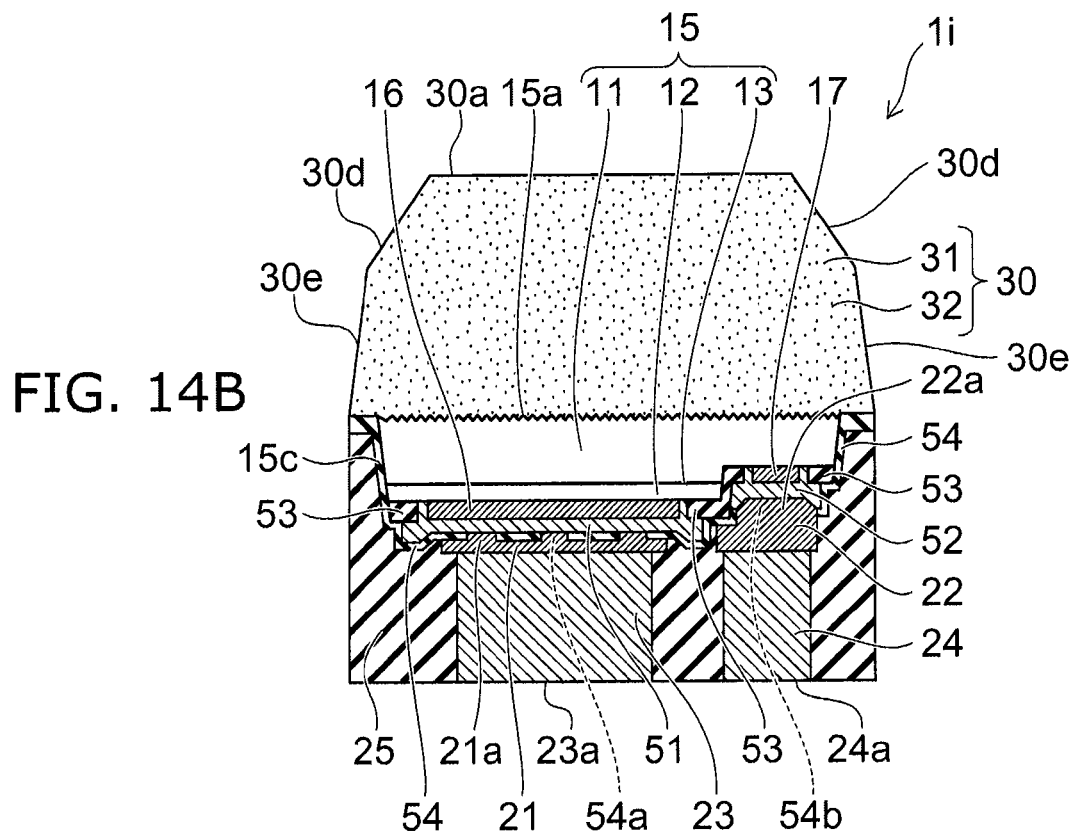
FIG. 14B is a schematic sectional view of a semiconductor light emitting device of a ninth embodiment.

FIG. 14B is a schematic sectional view of a semiconductor light emitting device 1i of a ninth embodiment.

In this semiconductor light emitting device 1i, the phosphor layer 30 of the semiconductor light emitting device 1c of the third embodiment shown in FIGS. 3A and 3B is provided on the first surface 15a in the semiconductor light emitting device 1e of the fifth embodiment shown in FIG. 11B.

In the above embodiments, the p-side wiring layer 21 and the n-side wiring layer 22 may be bonded to the pads of the mounting substrate without providing the p-side metal pillar 23 and the n-side metal pillar 24.

The p-side wiring layer 21 and the p-side metal pillar 23 are not limited to being separate. The p-side wiring layer 21 and the p-side metal pillar 23 may be provided integrally in the same process to constitute a p-side wiring section. Likewise, the n-side wiring layer 22 and the n-side metal pillar 24 are not limited to being separate. The n-side wiring layer 22 and the n-side metal pillar 24 may be provided integrally in the same process to constitute an n-side wiring section.

In the semiconductor light emitting devices of the above embodiments, the p-side external terminal may be formed by exposing not the lower surface but the side surface of the p-side metal pillar 23. The n-side external terminal may be formed by exposing not the lower surface but the side surface of the n-side metal pillar 24. The exposed surface of the side surface of these metal pillars may be bonded to the pads of the mounting substrate. Then, the first surface 15a is made perpendicular or oblique to the mounting surface. This can provide a semiconductor light emitting device of the side view type for emitting light in a lateral or oblique direction parallel to the mounting surface.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device comprising:
 a semiconductor layer including a first surface, a second surface opposite to the first surface, and a light emitting layer;
 a p-side electrode provided on the second surface in a region including the light emitting layer;
 an n-side electrode provided on the second surface in a region not including the light emitting layer;
 a first insulating film covering the p-side electrode and the n-side electrode;
 a p-side wiring section provided on the first insulating film and electrically connected to the p-side electrode through a first via penetrating through the first insulating film;
 an n-side wiring section provided on the first insulating film and electrically connected to the n-side electrode through a second via penetrating through the first insulating film; and a phosphor layer provided on the first surface, the phosphor layer having an upper surface and a plurality of oblique surfaces, each forming different oblique angles with respect to the first surface, the oblique surfaces including a first oblique surface forming an obtuse angle with respect to the upper surface and continuous with the upper surface, and a second oblique surface forming an obtuse angle with respect to the first oblique surface and continuous with the first oblique surface, and a thickness of the phosphor layer below the oblique surfaces being smaller than a thickness of the phosphor layer below the upper surface, and wherein a thickness of the phosphor layer above an end portion of the semiconductor layer is smaller than a thickness of the phosphor layer above a center portion of the first surface.

2. The device according to claim 1, wherein surfaces of the phosphor layer are formed entirely of the oblique surfaces.

3. The device according to claim 1, wherein an edge of the semiconductor layer is formed inside an edge of the phosphor layer.

4. The device according to claim 1, wherein the phosphor layer covers an edge of the semiconductor layer.

5. The device according to claim 1, wherein the oblique surfaces are provided at side end portions of the phosphor layer.

6. The device according to claim 1, wherein the oblique surfaces are provided at ends of the upper surface.

7. The device according to claim 1, wherein the first insulating film covers a side surface of the semiconductor layer continuing from the first surface.

8. The device according to claim 1, further comprising:
a second insulating film provided between the p-side wiring section and the n-side wiring section.

9. The device according to claim 8, wherein the second insulating film is a resin layer.

10. The device according to claim 1, wherein
the p-side wiring section includes:
  a p-side wiring layer provided on the first insulating film; and
  a p-side metal pillar provided on the p-side wiring layer and being thicker than the p-side wiring layer, and
the n-side wiring section includes:
  an n-side wiring layer provided on the first insulating film; and
  an n-side metal pillar provided on the n-side wiring layer and being thicker than the n-side wiring layer.

11. The device according to claim 1, wherein a thickness of the p-side wiring section and a thickness of the n-side wiring section are greater than a thickness of the semiconductor layer.

12. The device according to claim 1, wherein the upper surface of the phosphor layer is parallel to the first surface of the semiconductor layer.

13. The device according to claim 1, wherein the phosphor layer is not provided below the second surface of the semiconductor layer.

14. A light emitting module comprising:
a mounting substrate including a mounting surface;
a plurality of pads provided on the mounting surface of the mounting substrate; and
a plurality of semiconductor light emitting devices mounted on the pads,
each of the semiconductor light emitting devices including:
  a semiconductor layer including a first surface, a second surface opposite to the first surface, and a light emitting layer;
  a p-side electrode provided on the second surface in a region including the light emitting layer;
  an n-side electrode provided on the second surface in a region not including the light emitting layer;
  a first insulating film covering the p-side electrode and the n-side electrode;
  a p-side wiring section provided on the first insulating film and electrically connected to the p-side electrode through a first via penetrating through the first insulating film, and provided on the pad and electrically connected to the pad;
  an n-side wiring section provided on the first insulating film and electrically connected to the n-side electrode through a second via penetrating through the first insulating film, and provided on the pad and electrically connected to the pad; and
  a phosphor layer provided on the first surface,
  the phosphor layer having an upper surface and a plurality of oblique surfaces, each forming different oblique angles with respect to the first surface, the oblique surfaces including a first oblique surface forming an obtuse angle with respect to the upper surface and continuous with the upper surface, and a second oblique surface forming an obtuse angle with respect to the first oblique surface and continuous with the first oblique surface, and
a thickness of the phosphor layer below the oblique surfaces being smaller than a thickness of the phosphor layer below the upper surface, and
  wherein a thickness of the phosphor layer above an end portion of the semiconductor layer is smaller than a thickness of the phosphor layer above a center portion of the first surface.

15. The module according to claim 14, wherein
the upper surface of the phosphor layer is parallel to the mounting surface of the mounting substrate, and
the oblique surfaces of the phosphor layer are inclined with respect to the mounting surface of the mounting substrate.

16. A semiconductor light emitting device comprising:
a semiconductor layer including a first surface, a second surface opposite to the first surface, and a light emitting layer;
a p-side electrode provided on the second surface in a region including the light emitting layer;
an n-side electrode provided on the second surface in a region not including the light emitting layer;
an insulating film covering the p-side electrode, the n-side electrode, and a side surface of the semiconductor layer;
a p-side wiring section provided on the insulating film and electrically connected to the p-side electrode through a first via penetrating through the insulating film;
an n-side wiring section provided on the insulating film and electrically connected to the n-side electrode through a second via penetrating through the insulating film;
a resin layer having light blocking property against an emission light of the light emitting layer, provided between the p-side wiring section and the n-side wiring section, and covering the insulating film including the portion of the insulating film covering the side surface of the semiconductor layer; and
a phosphor layer provided on the first surface, the phosphor layer having an upper surface and an oblique surface, the oblique surface forming an obtuse angle with respect to the upper surface and inclined with respect to the first surface, and a thickness of the phosphor layer below the oblique surface being smaller than a thickness of the phosphor layer below the upper surface, and wherein the phosphor layer has a plurality of the oblique surfaces forming different oblique angles with respect to the first surface, the oblique surfaces include:

a first oblique surface forming an obtuse angle with respect to the upper surface and continuous with the upper surface;

a second oblique surface forming an obtuse angle with respect to the first oblique surface and continuous with the first oblique surface, and wherein a thickness of the phosphor layer above an end portion of the semiconductor layer is smaller than a thickness of the phosphor layer above a center portion of the first surface.

17. The device according to claim 16, wherein the insulating film is an inorganic film.

* * * * *